US010199566B2

(12) United States Patent
Oh et al.

(10) Patent No.: US 10,199,566 B2
(45) Date of Patent: Feb. 5, 2019

(54) SEMICONDUCTOR DEVICE HAVING MAGNETIC TUNNEL JUNCTION STRUCTURE AND METHOD OF FORMING THE SAME

(71) Applicant: SAMSUNG ELECTRONICS CO., LTD., Suwon-si, Gyeonggi-do (KR)

(72) Inventors: Jung-Ik Oh, Hwaseong-si (KR);
Jong-Kyu Kim, Seongnam-si (KR);
Jongchul Park, Seongnam-xi (KR);
Gwang-Hyun Baek, Seoul (KR);
Kyungrae Byun, Suwon-si (KR);
Hyun-Woo Yang, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 46 days.

(21) Appl. No.: 15/220,719

(22) Filed: Jul. 27, 2016

(65) Prior Publication Data
US 2017/0098759 A1    Apr. 6, 2017

(30) Foreign Application Priority Data

Oct. 1, 2015   (KR) .................. 10-2015-0138538

(51) Int. Cl.
H01L 29/82 (2006.01)
H01L 43/02 (2006.01)
H01L 43/08 (2006.01)
H01L 43/12 (2006.01)

(52) U.S. Cl.
CPC .............. H01L 43/02 (2013.01); H01L 43/08 (2013.01); H01L 43/12 (2013.01)

(58) Field of Classification Search
CPC ......... H01L 43/02; H01L 43/10; H01L 43/12; H01L 29/82; H01L 27/222; H01L 27/224; H01L 27/226
See application file for complete search history.

(56) References Cited

U.S. PATENT DOCUMENTS

| 7,989,224 | B2 | 8/2011 | Gaids |
| 8,772,888 | B2 | 7/2014 | Jung et al. |
| 8,866,242 | B2 | 10/2014 | Li et al. |
| 8,975,088 | B2 | 3/2015 | Satoh et al. |
| 2005/0094456 | A1* | 5/2005 | Lee .................... G11C 11/16 365/213 |
| 2013/0171743 | A1 | 7/2013 | Lee et al. |
| 2014/0227804 | A1 | 8/2014 | Hsu et al. |
| 2015/0021725 | A1 | 1/2015 | Hsu et al. |
| 2015/0069541 | A1 | 3/2015 | Chen et al. |
| 2015/0069547 | A1 | 3/2015 | Iwayama et al. |
| 2015/0092480 | A1 | 4/2015 | Choi et al. |

FOREIGN PATENT DOCUMENTS

| JP | 2013-065755 A | 4/2013 |
| JP | 2013-143548 A | 7/2013 |
| JP | 2013-201343 A | 10/2013 |
| KR | 10-2012-0108296 A | 3/2011 |

* cited by examiner

Primary Examiner — Steven Loke
Assistant Examiner — Scott Stowe
(74) Attorney, Agent, or Firm — Lee & Morse P.C.

(57) ABSTRACT

A semiconductor device includes a magnetic tunnel junction structure on a lower electrode, an intermediate electrode on the magnetic tunnel junction structure, and an upper electrode on the intermediate electrode, wherein the intermediate electrode includes a lower portion and an upper portion having a side surface profile different from that of the lower portion.

34 Claims, 28 Drawing Sheets

SEMICONDUCTOR DEVICE HAVING MAGNETIC TUNNEL JUNCTION STRUCTURE AND METHOD OF FORMING THE SAME

CROSS-REFERENCE TO RELATED APPLICATION

Korean Patent Application No. 10-2015-0138538, filed on Oct. 1, 2015, in the Korean Intellectual Property Office, and entitled: "Semiconductor Device Having Magnetic Tunnel Junction Structure and Method of Forming the Same," is incorporated by reference herein in its entirety.

BACKGROUND

1. Field

Embodiments relate to a semiconductor device in which a magnetic tunnel junction structure is interposed between a lower electrode and an upper electrode, and a method of forming the same.

2. Description of the Related Art

Semiconductor devices, such as magnetic memory devices, include magnetic tunnel junction structures. The magnetic tunnel junction structure may include a fixed magnetic pattern, a tunnel barrier pattern, and a free magnetic pattern which are stacked in a vertical direction. The magnetic tunnel junction structure may be formed by a physical etching process, e.g., an ion beam etch (IBE) process.

SUMMARY

In accordance with an aspect, a semiconductor device includes a magnetic tunnel junction structure disposed on a lower electrode, an intermediate electrode disposed on the magnetic tunnel junction structure, and an upper electrode disposed on the intermediate electrode. The intermediate electrode includes a lower portion and an upper portion having a side surface profile different from that of the lower portion.

Side surfaces of the magnetic tunnel junction structure may be vertically aligned with side surfaces of the lower portion, respectively.

A horizontal width of an uppermost end of the upper portion may be greater than that of a lowermost end of the upper portion.

The upper portion may be in direct contact with the lower portion. The horizontal width of the lowermost end of the upper portion may be smaller than that of an uppermost end of the lower portion.

Side surfaces of the upper portion may be vertically aligned with side surfaces of the upper electrode, respectively.

The semiconductor device may further include a liner insulating layer disposed on the magnetic tunnel junction structure and the lower portion. The liner insulating layer may expose an upper surface of the upper portion.

The upper surface of the upper portion may be at a lower level than an uppermost end of the liner insulating layer.

The semiconductor device may further include a by-product oxide layer interposed between the magnetic tunnel junction structure and the liner insulating layer and between the liner insulating layer and side surfaces of the lower portion.

In accordance with another aspect, a semiconductor device includes a magnetic tunnel junction structure, an upper electrode disposed on the magnetic tunnel junction structure and having a side surface profile different from that of the magnetic tunnel junction structure, and an intermediate electrode interposed between the magnetic tunnel junction structure and the upper electrode. The intermediate electrode includes a metal silicide.

The upper electrode may include a metal pattern, a barrier pattern disposed on the metal pattern, and a conductive pattern disposed on the barrier pattern. The metal pattern and the barrier pattern may be in U shapes.

In accordance with still another aspect, a method of forming a semiconductor device includes forming a magnetic tunnel junction layer on a substrate, forming a hard mask pattern including poly-silicon on the magnetic tunnel junction layer, patterning the magnetic tunnel junction layer using the hard mask pattern as an etching mask so that a magnetic tunnel junction structure is formed, and converting the poly-silicon of the hard mask pattern disposed on the magnetic tunnel junction structure into a metal silicide.

The hard mask pattern including the poly-silicon may further include an impurity.

The impurity may include carbon.

The method of forming the semiconductor device may further include oxidizing etching by-products disposed on surfaces of the magnetic tunnel junction structure and the hard mask pattern, before converting the poly-silicon of the hard mask pattern into the metal silicide.

The method of forming the semiconductor device may further include forming a liner insulating layer on the substrate on which the oxidizing of the etching by-products is complete, before converting the poly-silicon of the hard mask pattern into the metal silicide.

The method of forming the semiconductor device may further include removing the oxidized etching by-products, before forming the liner insulating layer.

In accordance with yet another aspect, a method of forming a semiconductor device includes forming a magnetic tunnel junction layer on a lower electrode, forming a poly-silicon layer on the magnetic tunnel junction layer, patterning the poly-silicon layer so that a hard mask pattern is formed, patterning the magnetic tunnel junction layer using the hard mask pattern as an etching mask so that a magnetic tunnel junction structure is formed, oxidizing etching by-products deposited on the magnetic tunnel junction structure and the hard mask pattern so that a by-product oxide layer is formed, forming a metal layer on an upper surface of the hard mask pattern disposed on the magnetic tunnel junction structure, forming an intermediate electrode on the magnetic tunnel junction structure by a silicide process, and forming an upper electrode on the intermediate electrode.

The method of forming the semiconductor device may further include forming a barrier layer on the metal layer, before the intermediate electrode is formed.

The forming the intermediate electrode may include converting materials of the entire hard mask pattern and a part of the metal layer into metal silicide.

The method forming the semiconductor device may further include removing the metal layer not converted into the intermediate electrode, before the upper electrode is formed.

In accordance with yet another aspect, a semiconductor device may include a magnetic tunnel junction structure on a lower electrode, an intermediate electrode on the magnetic tunnel junction structure, the intermediate electrode including metal silicide, and an upper electrode directly on the intermediate electrode, the metal silicide in the intermediate electrode including a same metal as the upper electrode.

A shape of a cross-section of the upper electrode may be different from a shape of a cross-section of the intermediate electrode.

The intermediate electrode may include a first portion and a second portion, the first and second portions have different shapes in a cross-sectional view.

The second portion may be between the first portion and the upper electrode, sidewalls of the upper electrodes being collinear with respective sidewalls of the second portion.

Sidewalls of the first portion may be collinear with respective sidewalls of the magnetic tunnel junction structure.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
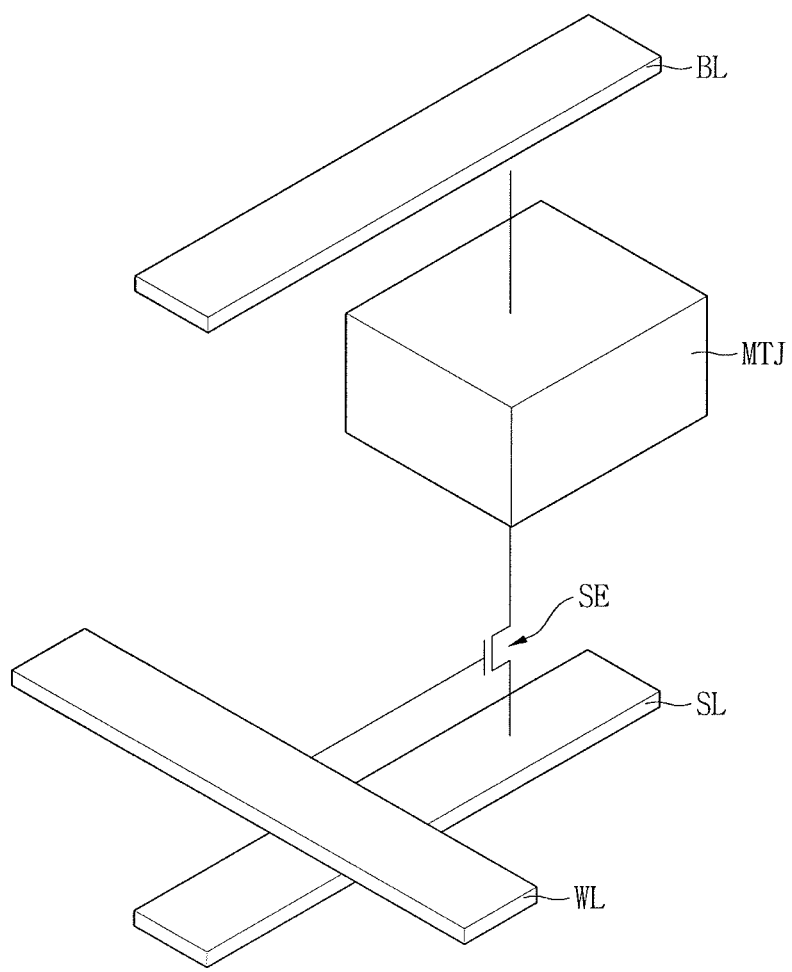
FIG. 1 illustrates a schematic view of a semiconductor device according to one embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer (or element) is referred to as being "on" another layer or substrate, it may be directly on the other layer or substrate, or intervening layers may also be present. In addition, it will also be understood that when a layer is referred to as being "between" two layers, it may be the only layer between the two layers, or one or more intervening layers may also be present. Like reference numerals refer to like elements throughout.

It will be understood that, although the terms first, second, A, B, etc. may be used herein in reference to elements of embodiments, such elements should not be construed as limited by these terms. These terms are only used to distinguish one element from another element. For example, a first element could be termed a second element, and a second element could be termed a first element, without departing from the scope of the embodiments.

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In addition, unless otherwise defined, all terms (including technical and scientific terms) used herein have the same meaning as commonly understood by one of skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic view illustrating a semiconductor device according to one embodiment.

Referring to FIG. 1, the semiconductor device according to the embodiment may include a word line WL, a bit line BL, a source line SL, a switching element SE, and a magnetic tunnel junction element MTJ.

The word line WL and the bit line BL may each extend in one direction. For example, the bit line BL and the word line WL may perpendicularly cross each other. The source line SL may extend in one direction. For example, the source line SL and the bit line BL may be parallel to each other.

The switching element SE may be interposed between the source line SL and the magnetic tunnel junction element MTJ. The switching element SE may be controlled by a signal applied through the word line WL. For example, the switching element SE may be a transistor including a gate electrode electrically connected to the word line WL.

The magnetic tunnel junction element MTJ may be interposed between the switching element SE and the bit line BL. A resistance value of the magnetic tunnel junction element MTJ may be changed by a signal applied through the word line WL and the bit line BL.

Figure 2:
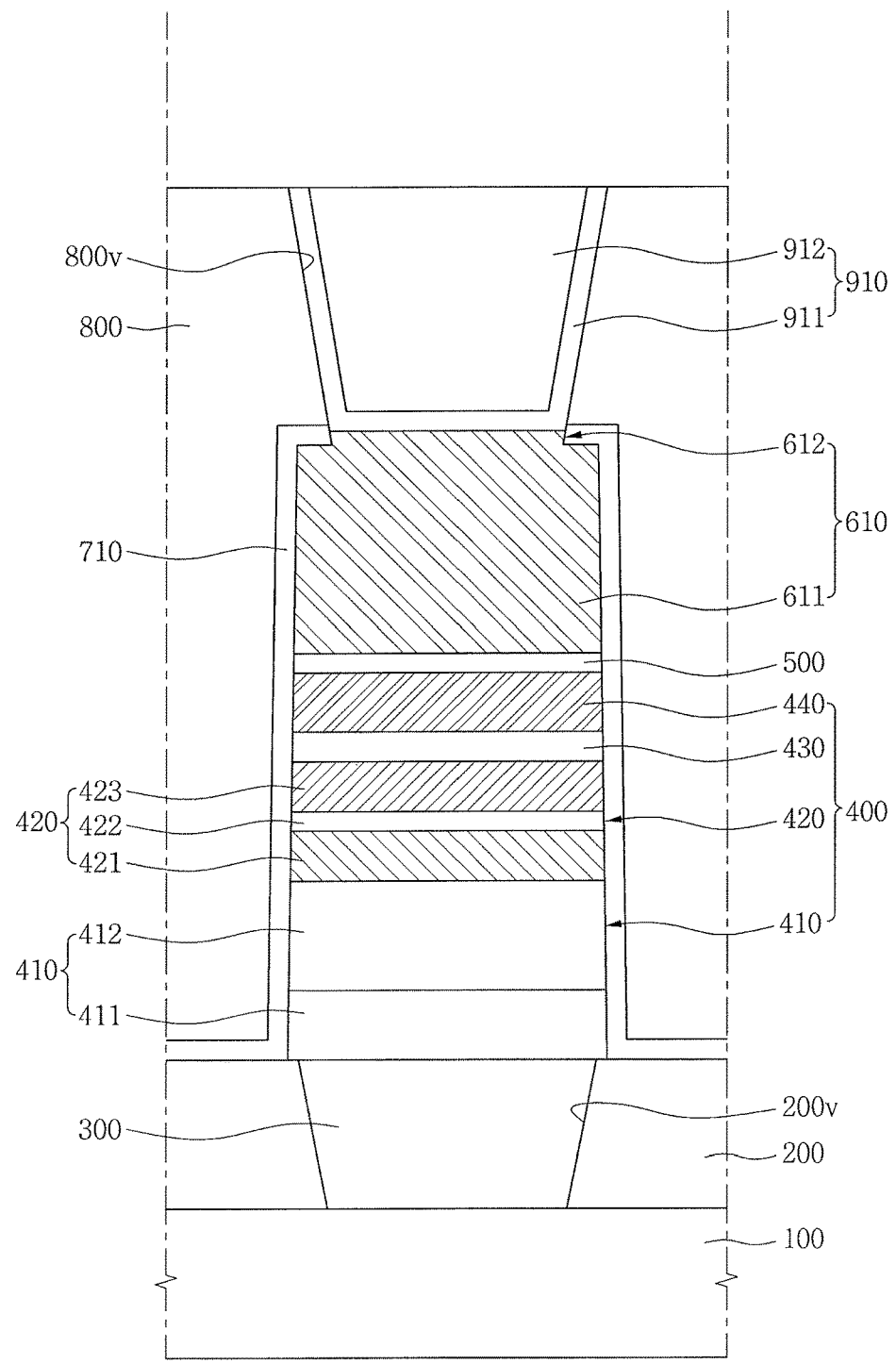
FIG. 2 illustrates a view of a magnetic tunnel junction element of a semiconductor device according to one embodiment.

FIG. 2 is a view illustrating a magnetic tunnel junction element of a semiconductor device according to one embodiment.

Referring to FIG. 2, the magnetic tunnel junction element of the semiconductor device according to the embodiment may include a substrate 100, a lower interlayer insulating layer 200, a lower electrode 300, a magnetic tunnel junction structure 400, a capping pattern 500, an intermediate electrode 610, a liner insulating layer 710, an upper interlayer insulating layer 800, and an upper electrode 910.

The substrate 100 may include a semiconductor wafer. For example, the substrate 100 may include a single crystalline silicon wafer or silicon-on-insulator (SOI) wafer.

The lower interlayer insulating layer 200 may be disposed on the substrate 100. The word line WL, the source line SL, and the switching element SE shown in FIG. 1 may be interposed between the substrate 100 and the lower interlayer insulating layer 200.

The lower interlayer insulating layer 200 may include an insulating material. For example, the lower interlayer insulating layer 200 may include silicon oxide and/or silicon nitride. The lower interlayer insulating layer 200 may have a multilayer structure.

The lower interlayer insulating layer 200 may include a lower via-hole 200v. The lower via-hole 200v may pass through the lower interlayer insulating layer 200. For example, one electrode of the switching element SE shown in FIG. 1 may be exposed by the lower via-hole 200v.

The lower electrode 300 may be electrically connected to the switching element SE shown in FIG. 1. The lower electrode 300 may be disposed inside the lower via-hole 200v. A level of an upper surface of the lower electrode 300 may be the same as that of an upper surface of the lower interlayer insulating layer 200.

The lower electrode 300 may include a conductive material. For example, the lower electrode 300 may include a metal, e.g., Cu, W, or Ti, and/or a metal nitride.

The magnetic tunnel junction structure 400 may be disposed above the lower electrode 300. The magnetic tunnel junction structure 400 may include a seed pattern 410, a fixed magnetic pattern 420, a tunnel barrier pattern 430, and a free magnetic pattern 440.

The seed pattern 410 may block an influence of the lower electrode 300 on formation of the fixed magnetic pattern 420. The seed pattern 410 may be disposed close to the lower electrode 300. The seed pattern 410 may include an amorphous seed layer 411 and a crystalline structural seed layer 412.

The amorphous seed layer 411 may be in direct contact with an upper surface of the lower electrode 300. The amorphous seed layer 411 may be in an amorphous state. The amorphous seed layer 411 may include a conductive material. For example, the amorphous seed layer 411 may include a magnetic material. The amorphous seed layer 411 may further include an amorphous material. For example, the amorphous seed layer 411 may include CFBTa.

Side surfaces of the amorphous seed layer 411 may be sloped. For example, a horizontal width of an uppermost end of the amorphous seed layer 411 may be smaller than that of a lowermost end of the amorphous seed layer 411, e.g., the amorphous seed layer 411 may have a trapezoidal cross-section relative to the substrate 100.

The crystalline structural seed layer 412 may be disposed on the amorphous seed layer 411. The crystalline structural seed layer 412 may be in direct contact with an upper surface of the amorphous seed layer 411. For example, the crystalline structural seed layer 412 may have a same side surface profile, e.g., outline, as that of the amorphous seed layer 411. A horizontal width of an uppermost end of the crystalline structural seed layer 412 may be smaller than that of a lowermost end of the crystalline structural seed layer 412.

The crystalline structural seed layer 412 may be in a crystalline structural state. The crystalline structural seed layer 412 may include a conductive material. The crystalline structural seed layer 412 may include a material different from that of the amorphous seed layer 411. For example, the crystalline structural seed layer 412 may include a non-magnetic material. For example, the crystalline structural seed layer 412 may include Ru.

The fixed magnetic pattern 420 may be disposed on the seed pattern 410. The fixed magnetic pattern 420 may include a synthetic anti-ferromagnetic (SAF) structure. For example, the fixed magnetic pattern 420 may include a lower fixed magnetic layer 421, a spacer 422, and an upper fixed magnetic layer 423.

The lower fixed magnetic layer 421 may be disposed close to the seed pattern 410. The lower fixed magnetic layer 421 may be in direct contact with an upper surface of the crystalline structural seed layer 412. For example, the crystalline structural seed layer 412 may have a same side surface profile as that of the lower fixed magnetic layer 421. A horizontal width of an uppermost end of the lower fixed magnetic layer 421 may be smaller than that of a lowermost end of the lower fixed magnetic layer 421.

The lower fixed magnetic layer 421 may include a magnetic material. The lower fixed magnetic layer 421 may have a vertical magnetization property. A magnetization direction of the lower fixed magnetic layer 421 may be perpendicular to a surface of the substrate 100. For example, the lower fixed magnetic layer 421 may include at least one of Co, Fe, and Ni and one of Pt, Pd, Ru, and Ta.

The magnetization direction of the lower fixed magnetic layer 421 may be fixed. The magnetization direction of the lower fixed magnetic layer 421 is not influenced by an external magnetic field. For example, 421 the magnetization direction of the lower fixed magnetic layer may not be changed by a magnetic field formed between the lower electrode 300 and the upper electrode 910.

The spacer 422 may be disposed on the lower fixed magnetic layer 421. The spacer 422 may be in direct contact with an upper surface of the lower fixed magnetic layer 421. For example, the lower fixed magnetic layer 421 may have a same side surface profile as that of the spacer 422. A horizontal width of an uppermost end of the spacer 422 may be smaller than that of a lowermost end of the spacer 422.

The spacer 422 may include a non-magnetic material. For example, the spacer 422 may include Ru, Ir, Re, or Os.

The upper fixed magnetic layer 423 may be disposed on the spacer 422. The upper fixed magnetic layer 423 may be in direct contact with an upper surface of the spacer 422. For example, the spacer 422 may have a same side surface profile as that of the upper fixed magnetic layer 423. A horizontal width of an uppermost end of the upper fixed magnetic layer 423 may be smaller than that of a lowermost end of the upper fixed magnetic layer 423.

The upper fixed magnetic layer 423 may include a magnetic material. The upper fixed magnetic layer 423 may have a vertical magnetization property. The upper fixed magnetic layer 423 may further include an amorphous material. For example, the upper fixed magnetic layer 423 may include at least one of Co, Fe, and Ni, one of Pt, Pd, Ru, and Ta, and one of B, P, As, and Bi.

A magnetization direction of the upper fixed magnetic layer 423 may be fixed. For example, the magnetization direction of the upper fixed magnetic layer 423 may not be changed by a magnetic field formed between the lower electrode 300 and the upper electrode 910.

The tunnel barrier pattern 430 may be disposed on the fixed magnetic pattern 420. The tunnel barrier pattern 430 may be in direct contact with an upper surface of the upper fixed magnetic layer 423. For example, the upper fixed magnetic layer 423 may have a same side surface profile as that of the tunnel barrier pattern 430. A horizontal width of an uppermost end of the tunnel barrier pattern 430 may be smaller than that of a lowermost end of the tunnel barrier pattern 430.

The tunnel barrier pattern 430 may include a non-magnetic material. For example, the tunnel barrier pattern 430 may include MgO.

The free magnetic pattern 440 may be disposed on the tunnel barrier pattern 430. The free magnetic pattern 440 may be in direct contact with an upper surface of the tunnel barrier pattern 430. For example, the tunnel barrier pattern 430 may have a same side surface profile as that of the free magnetic pattern 440. A horizontal width of an uppermost end of the free magnetic pattern 440 may be smaller than that of a lowermost end of the free magnetic pattern 440.

The free magnetic pattern 440 may include a magnetic material. The free magnetic pattern 440 may have a vertical magnetization property. The free magnetic pattern 440 may further include an amorphous material. For example, the free magnetic pattern 440 may include at least one of Co, Fe, and Ni, one of Pt, Pd, Ru, and Ta, and one of B, P, As, and Bi.

A magnetization direction of the free magnetic pattern 440 may be changed by an external magnetic field. For example, the magnetization direction of the free magnetic pattern 440 may be changed by a magnetic field formed between the lower electrode 300 and the upper electrode 910. A resistance value of the magnetic tunnel junction structure 400 according to the embodiment may be changed by the magnetization direction of the free magnetic pattern 440.

The capping pattern 500 may be disposed on the magnetic tunnel junction structure 400. The capping pattern 500 may be in direct contact with an upper surface of the free magnetic pattern 440. For example, the free magnetic pattern 440 may have a same side surface profile as that of the capping pattern 500. A horizontal width of an uppermost end of the capping pattern 500 may be smaller than that of a lowermost end of the capping pattern 500.

The capping pattern 500 may include a conductive material. For example, the capping pattern 500 may include at least one of Cu, Ta, Al, Au, Ti, Ru, TiN, and TaN. For example, the capping pattern 500 may have a multilayer structure.

The intermediate electrode 610 may be disposed on the capping pattern 500. The intermediate electrode 610 may include a lower portion 611 and an upper portion 612.

The lower portion 611 of the intermediate electrode 610 may be disposed close to the magnetic tunnel junction structure 400. The lower portion 611 may be in direct contact with an upper surface of the capping pattern 500. For example, the capping pattern 500 may have a same side surface profile as the lower portion 611. A side surface profile of the magnetic tunnel junction structure 400 may be the same as that of the lower portion 611. A horizontal width of an uppermost end of the lower portion 611 may be smaller than a lowermost end of the lower portion 611.

The upper portion 612 of the intermediate electrode 610 may be disposed on the lower portion 611. A lowermost end of the upper portion 612 may be in direct contact with an uppermost end of the lower portion 611. For example, the upper portion 612 may have a different side surface profile, e.g., outline, from that of the lower portion 611. A horizontal width of an uppermost end of the upper portion 612 may be greater than that of a lowermost end of the upper portion 612.

A horizontal width of a lowermost end of the upper portion 612 may be smaller than that of an uppermost end of the lower portion 611, e.g., the upper portion 612 may have an inverted-trapezoidal cross-section relative to the substrate 100. For example, the upper portion 612 may have a shape protruding from the uppermost end of the lower portion 611. A vertical length, e.g., height, of the upper portion 612 may be smaller than that of the lower portion 611.

The intermediate electrode 610 may include a metal silicide. The lower portion 611 and the upper portion 612 may include a metal silicide.

The liner insulating layer 710 may be disposed, e.g., conformally, on the substrate 100 and the magnetic tunnel junction structure 400. The liner insulating layer 710 may extend onto a surface of the lower portion 611 of the intermediate electrode 610.

An upper surface of the upper portion 612 of the intermediate electrode 610 may not be covered by the liner insulating layer 710. The liner insulating layer 710 may surround only side surfaces of the upper portion 612. The liner insulating layer 710 may expose the upper surface of the upper portion 612.

The liner insulating layer 710 may have a predetermined thickness. For example, a thickness of the liner insulating layer 710 on a side surface of the lower portion 611 along a horizontal direction may be the same as a thickness of the liner insulating layer 710 on an upper surface of the lower portion 611 along a vertical direction. A thickness of the upper portion 612 may be smaller than a thickness of the liner insulating layer 710 along the vertical direction, i.e., a direction normal to the substrate 100. For example, the upper surface of the upper portion 612 may be at a lower level than an uppermost end of the liner insulating layer 710, i.e., a distance between the upper surface of the upper portion 612 and the substrate 100 may be smaller than a distance between the uppermost surface of the liner insulating layer 710 and the substrate 100.

The liner insulating layer 710 may include an insulating material. For example, the liner insulating layer 710 may include silicon nitride.

The upper interlayer insulating layer 800 may be disposed on the liner insulating layer 710. The upper interlayer insulating layer 800 may cover the magnetic tunnel junction structure 400 and the intermediate electrode 610. For example, an upper surface of the upper interlayer insulating layer 800 may be at a higher level than the uppermost end of the liner insulating layer 710.

The upper interlayer insulating layer 800 may include an insulating material. The upper interlayer insulating layer 800 may include a material having etching selectivity with respect to the liner insulating layer 710. For example, the upper interlayer insulating layer 800 may include silicon oxide.

The upper interlayer insulating layer 800 may include an upper via-hole 800v. The upper via-hole 800v may expose the upper surface of the upper portion 612 of the intermediate electrode 610. For example, the upper via-hole 800v may pass through the upper interlayer insulating layer 800. A horizontal width of a bottom surface of the upper via-hole 800v may be the same as that of the upper surface of the upper portion 612.

A sidewall of the upper via-hole 800v may have a profile different from a side surface profile of the magnetic tunnel junction structure 400. A sidewall profile of the upper via-hole 800v may be different from a side surface profile of the lower portion 611. For example, the sidewall of the upper via-hole 800v may have the same profile as the side surface of the upper portion 612. A horizontal width of the upper via-hole 800v may become small in a direction close to the upper portion 612.

The upper electrode 910 may be electrically connected to the bit line BL shown in FIG. 1. The upper electrode 910 may be disposed in the upper via-hole 800v. For example, an upper surface of the upper electrode 910 may be at the same level as the upper surface of the upper interlayer insulating layer 800.

The upper electrode 910 may be in direct contact with the upper surface of the upper portion 612. The upper electrode 910 may have a side surface profile different from that of the magnetic tunnel junction structure 400. For example, the upper electrode 910 may have the same side surface profile as the upper portion 612.

The upper electrode 910 may include an upper barrier pattern 911 and an upper conductive pattern 912. The upper barrier pattern 911 may be interposed between the intermediate electrode 610 and the upper conductive pattern 912. The upper barrier pattern 911 may extend between the upper interlayer insulating layer 800 and the upper conductive pattern 912. For example, the upper barrier pattern 911 may be in a U shape.

The upper barrier pattern 911 and the upper conductive pattern 912 may include a conductive material. For example, the upper barrier pattern 911 may include a metal nitride, and the upper conductive pattern 912 may include a metal.

As a result, in the semiconductor device according to the embodiment, the intermediate electrode 610 including a metal silicide may be interposed between the magnetic tunnel junction structure 400 and the upper electrode 910. Thus, in the semiconductor device according to the embodiment, a process time for oxidation of etching by-products generated during a process of etching the magnetic tunnel junction structure may be reduced. Accordingly, in the semiconductor device according to the embodiment, a potential electrical short caused by etching by-products may be prevented without degradation of the electromagnetic properties of the magnetic tunnel junction structure.

Figure 3:
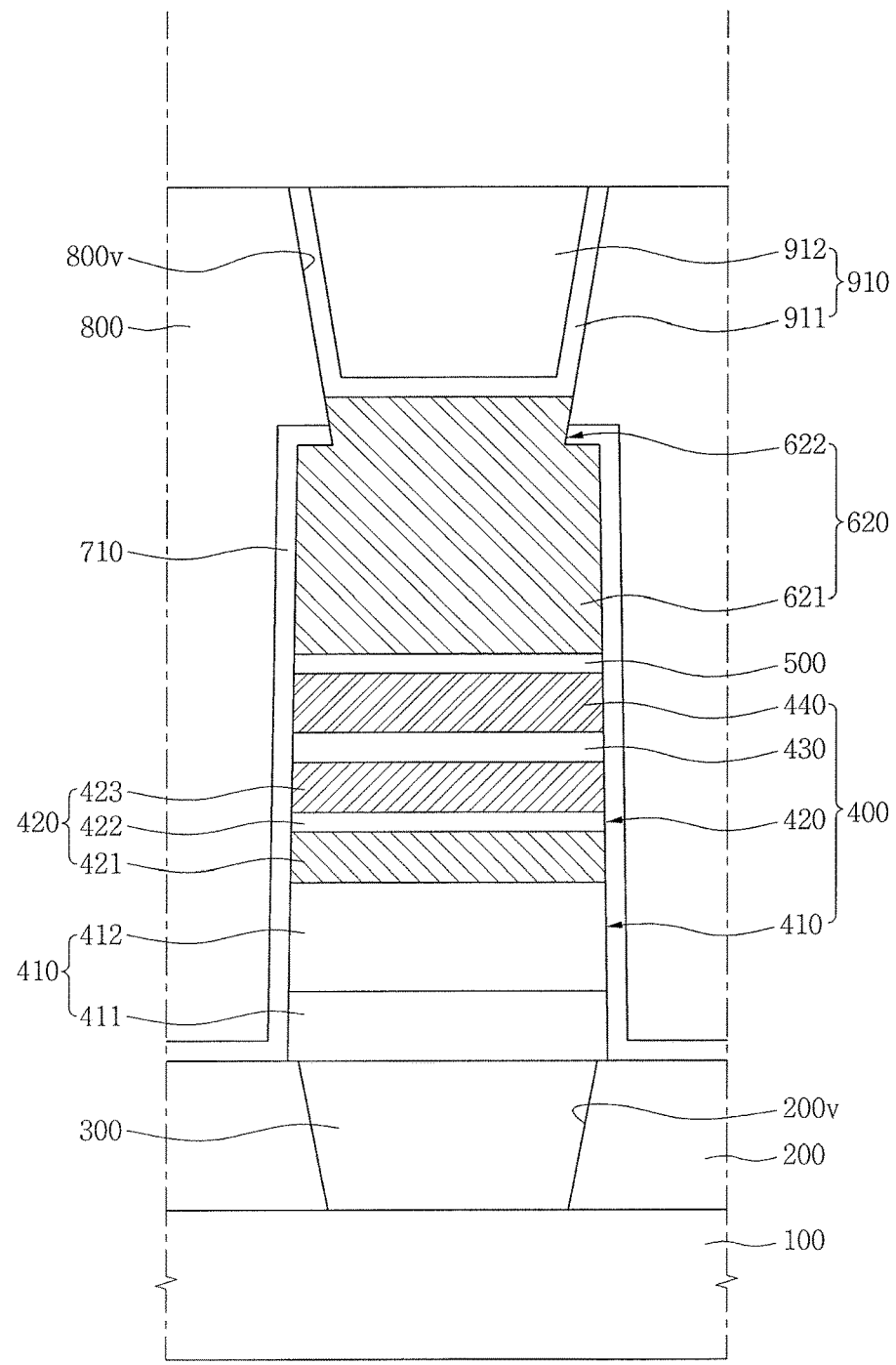
FIGS. 3 to 10 illustrate views of respective magnetic tunnel junction elements of a semiconductor device according to other embodiments.

In the semiconductor device according to the embodiment, the upper surface of the upper portion 612 of the intermediate electrode 610 is described as being at a lower level than the uppermost end of the liner insulating layer 710. However, as shown in FIG. 3, in the semiconductor device according to another embodiment, the intermediate electrode 610 may include an upper portion 622 having a greater vertical length than the thickness of the liner insulating layer 710.

Figure 4:
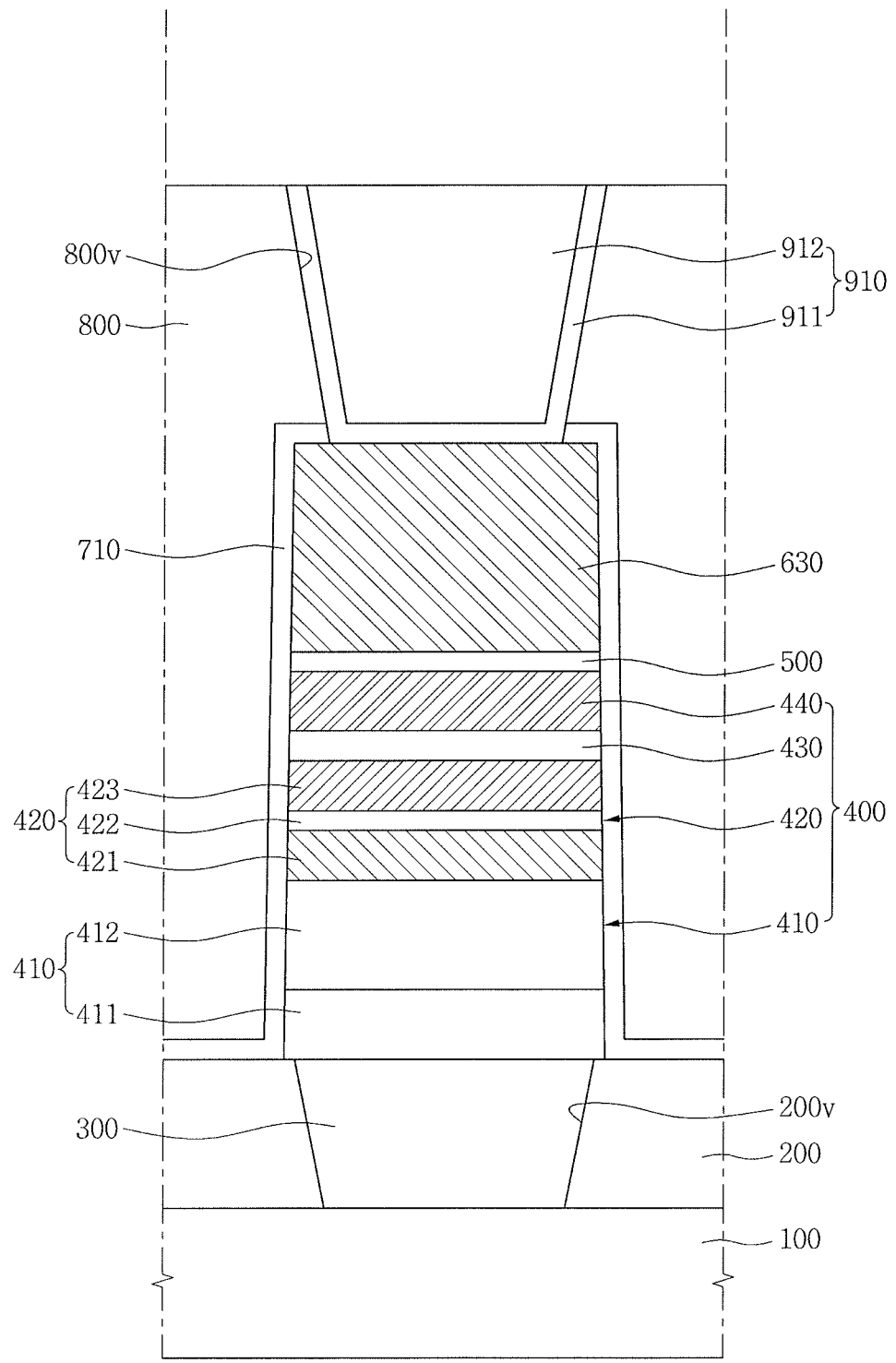
Figure 5:
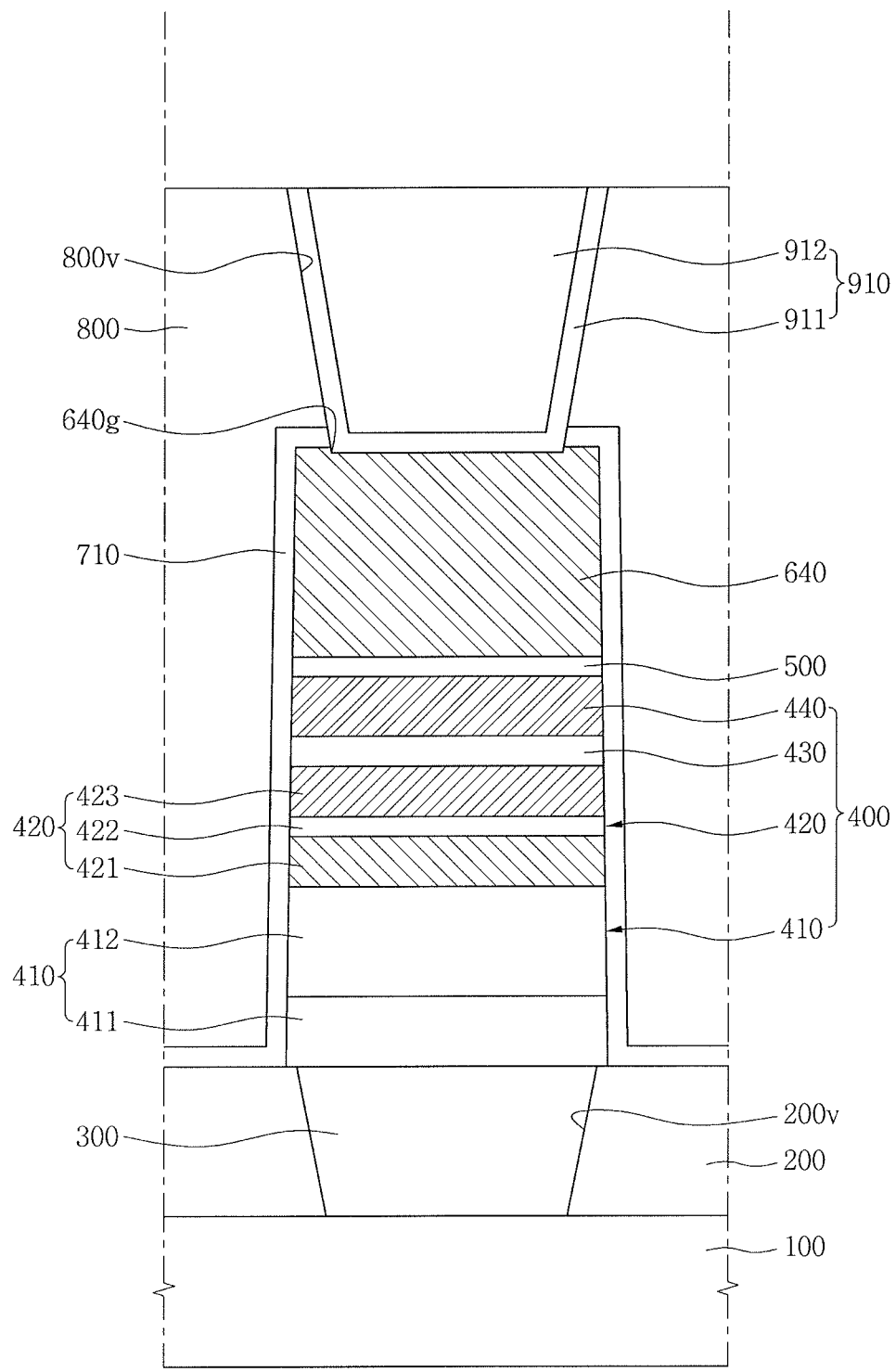

In the semiconductor device according to the embodiment, the intermediate electrode 610 is described to include the lower portion 611 and the upper portion 612 having the side surface profile different from that of the lower portion 611. However, as shown in FIG. 4, a semiconductor device according to another embodiment may include an intermediate electrode 630 having a planar upper surface and a single side surface profile. Further, as shown in FIG. 5, a semiconductor device according to still another embodiment may include an intermediate electrode 640 in which a recessed portion 640g is formed in an upper portion thereof, and the upper electrode 910 extends into the recessed portion 640g of the intermediate electrode 640.

Figure 6:
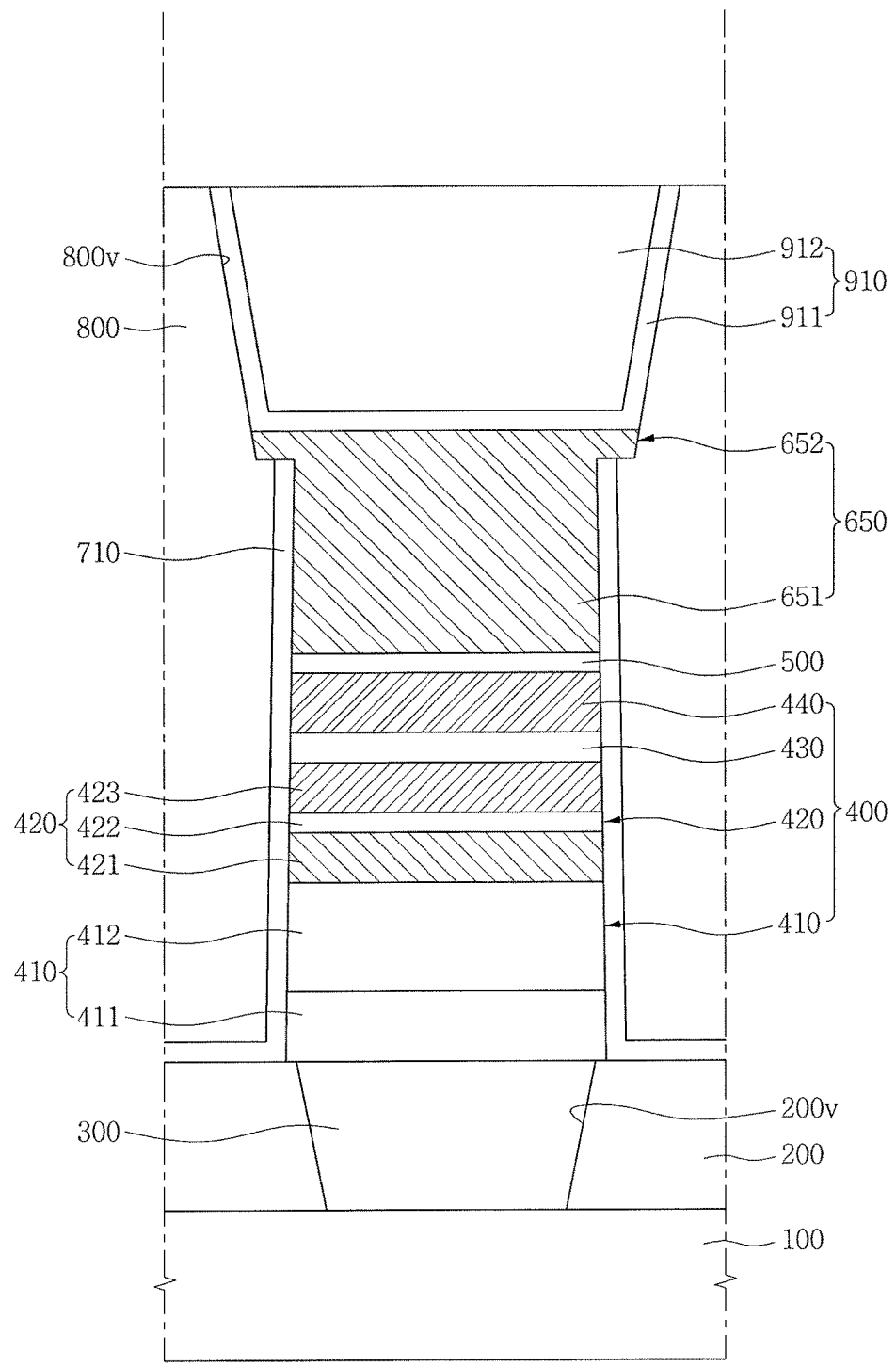

In the semiconductor device according to the embodiment, the horizontal width of the lowermost end of the upper portion 612 is described to be smaller than that of the uppermost end of the lower portion 611. However, as shown in FIG. 6, a semiconductor device according to another embodiment may include an intermediate electrode 650 in which a horizontal width of a lowermost end of an upper portion 652 is greater than that of an uppermost end of a lower portion 651.

Figure 7:
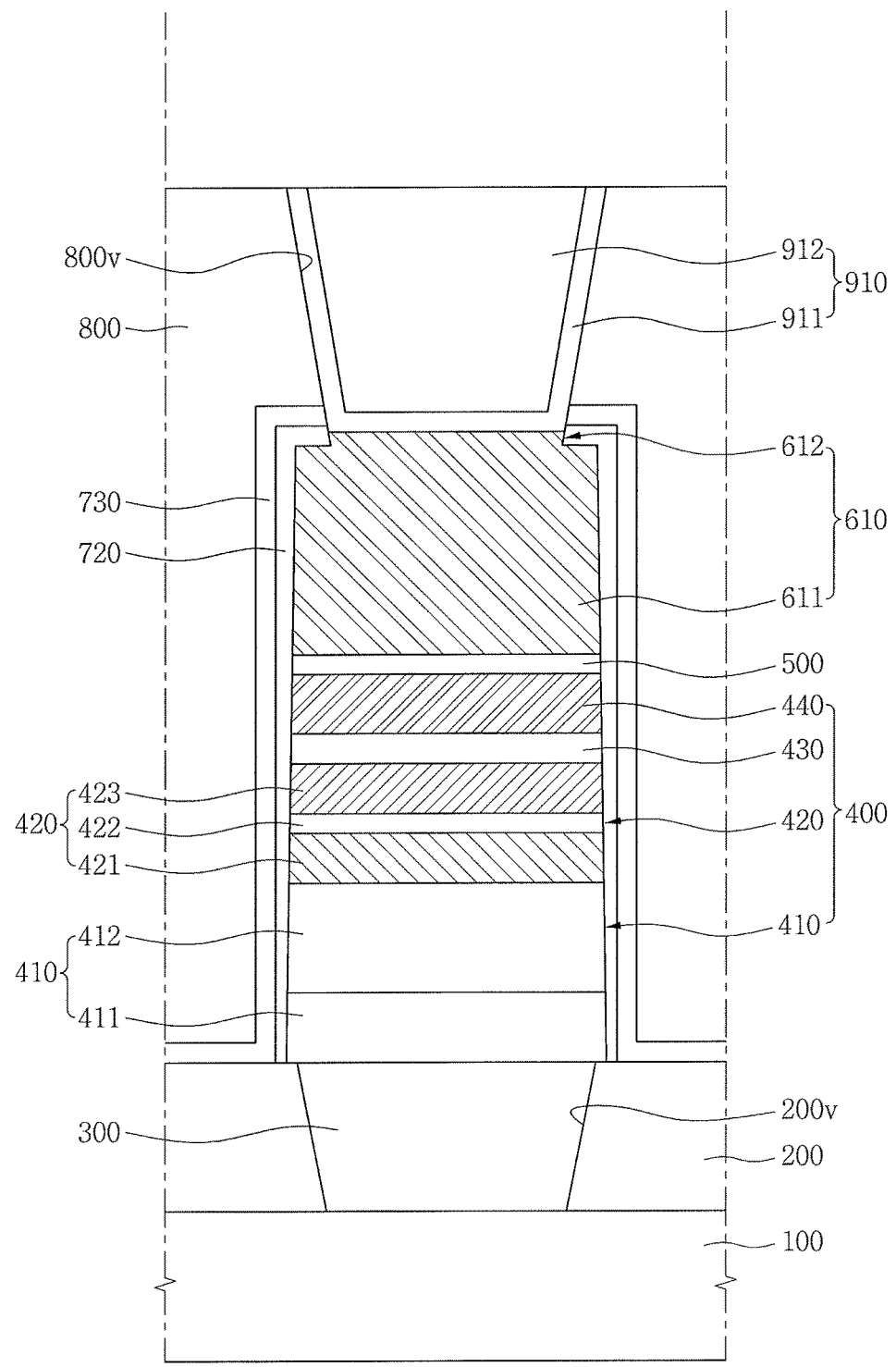

FIG. 7 is a view illustrating a magnetic tunnel junction element of a semiconductor device according to an embodiment.

Referring to FIG. 7, the magnetic tunnel junction element of the semiconductor device according to the embodiment may include the substrate 100, the lower interlayer insulating layer 200, the lower electrode 300, the magnetic tunnel junction structure 400, the capping pattern 500, the intermediate electrode 610, a by-product oxide layer 720, a liner insulating layer 730, the upper interlayer insulating layer 800, and the upper electrode 910.

The intermediate electrode 610 may include the lower portion 611 and the upper portion 612 having a side surface profile different from that of the lower portion 611.

The by-product oxide layer 720 may be disposed on surfaces of the magnetic tunnel junction structure 400 and the lower portion 611. The by-product oxide layer 720 may not cover an upper surface of the upper portion 612 of the intermediate electrode 610. The by-product oxide layer 720 may expose the upper surface of the upper portion 612.

Side surfaces of the upper portion 612 may be surrounded by the by-product oxide layer 720. For example, the upper surface of the upper portion 612 may be at a lower level than an upper surface of the by-product oxide layer 720.

The by-product oxide layer 720 may include an oxide. The by-product oxide layer 720 may have various thicknesses according to positions thereof. For example, a horizontal width, i.e., thickness, of the by-product oxide layer 720 may vary in accordance with distance from the substrate 100, e.g., the thickness of the by-product oxide layer 720 may decrease as a distance from the substrate 100 decreases.

The liner insulating layer 730 may be disposed on the substrate 100 and the by-product oxide layer 720. The liner insulating layer 730 may surround a lower portion of side surfaces of the upper electrode 910.

Figure 8:
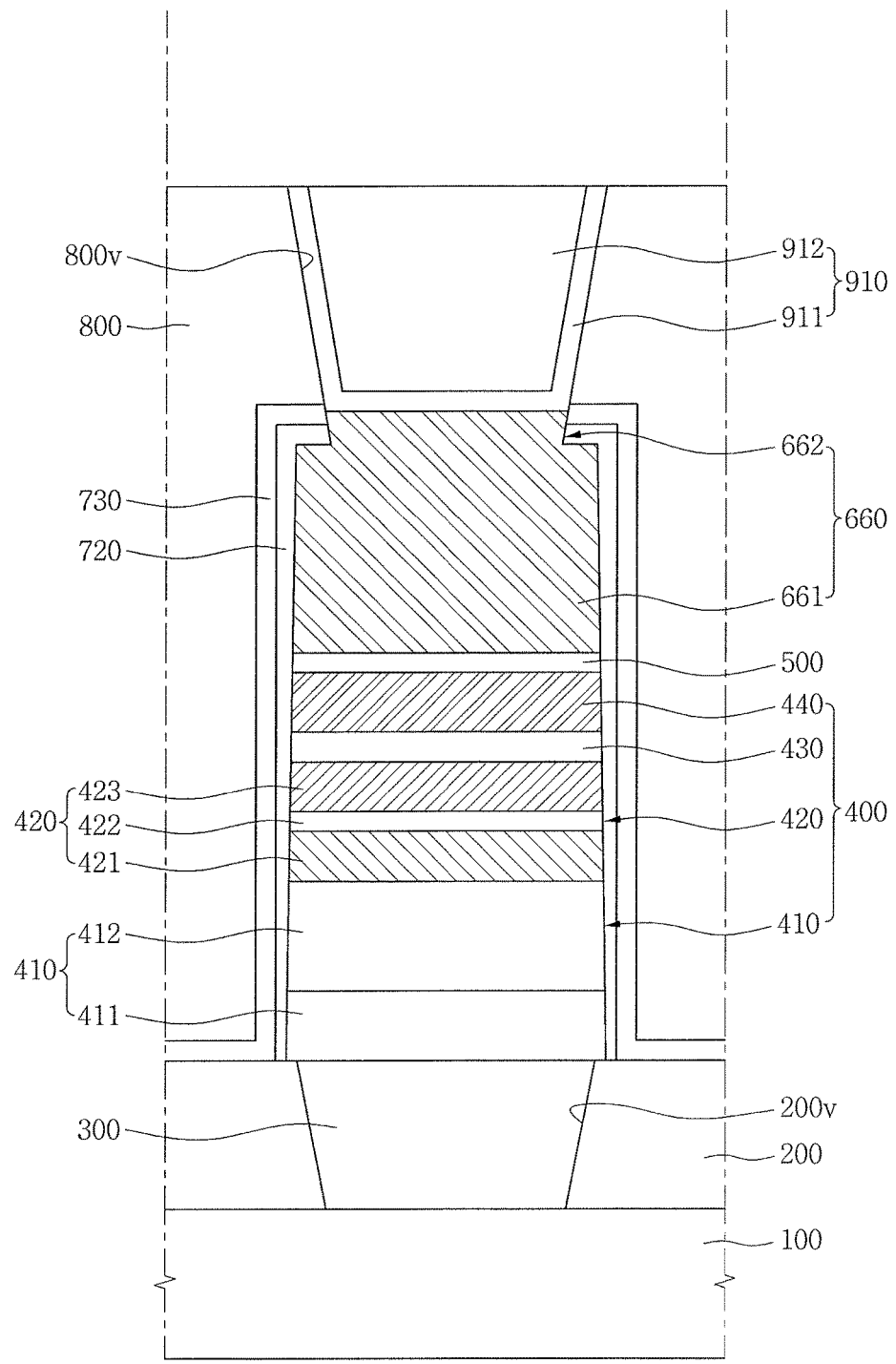

In the semiconductor device according to the embodiment, an uppermost end of the intermediate electrode 610 is described as being at a lower level than an uppermost end of the by-product oxide layer 720. However, as shown in FIG. 8, in a semiconductor device according to another embodiment, an upper surface of an upper portion 662 of the intermediate electrode 660 may be at a higher level than the uppermost end of the by-product oxide layer 720, and may be at a lower level than the liner insulating layer 730. Further, in a semiconductor device according to still another embodiment, an upper surface of an upper portion of the intermediate electrode may be at a higher level than the by-product oxide layer and the liner insulating layer.

Figure 9:
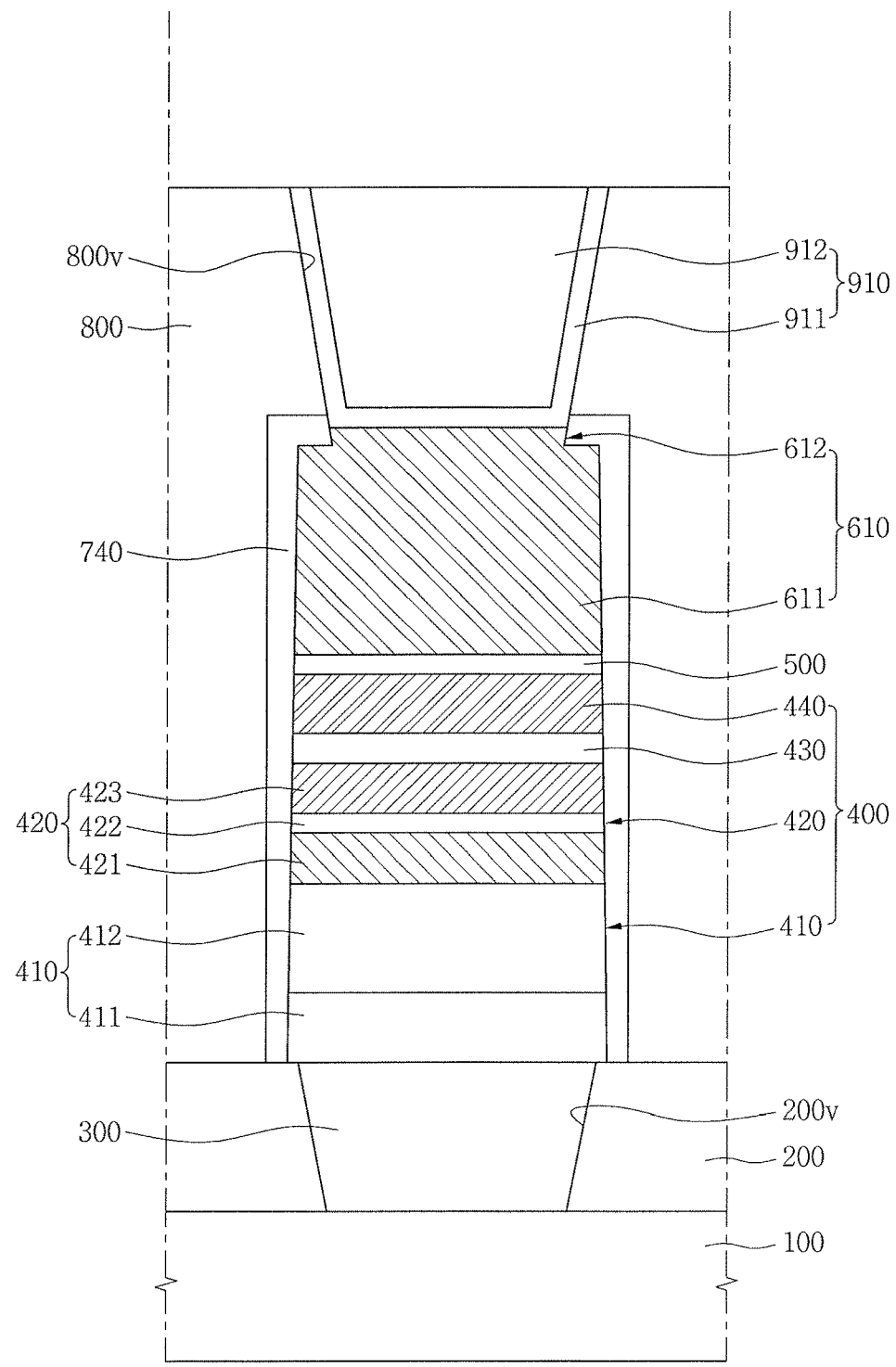

In the semiconductor device according to the embodiment, the liner insulating layer 730 is described as being interposed between the by-product oxide layer 720 and the upper interlayer insulating layer 800. However, as shown in FIG. 9, in a semiconductor device according to another embodiment, a by-product oxide layer 740 may be in direct contact with the upper interlayer insulating layer 800.

Figure 10:
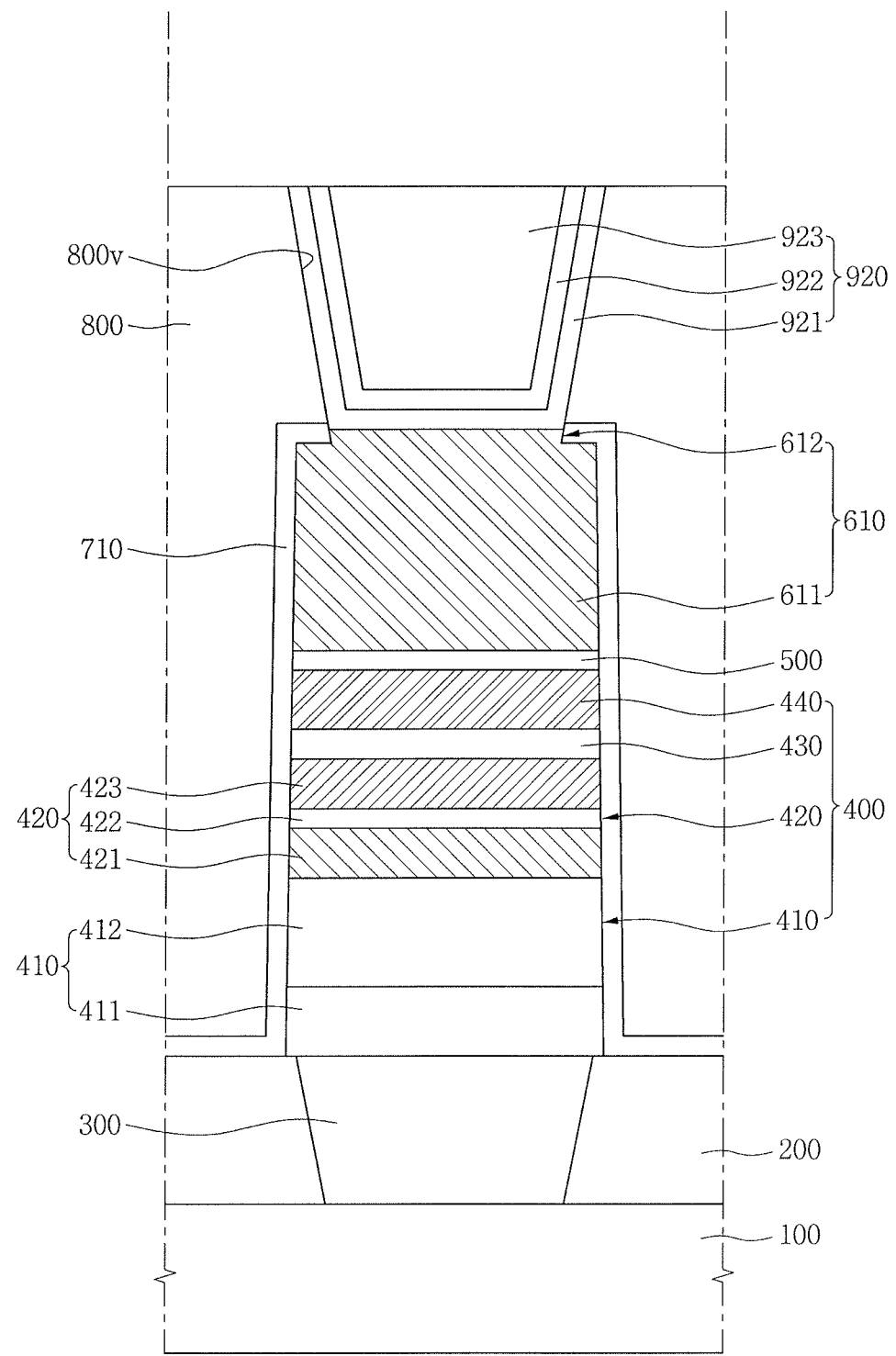

FIG. 10 is a view illustrating a magnetic tunnel junction element of the semiconductor device according to an embodiment.

Referring to FIG. 10, a magnetic tunnel junction element of the semiconductor device according to the embodiment may include the substrate 100, the lower interlayer insulating layer 200, the lower electrode 300, the magnetic tunnel junction structure 400, the capping pattern 500, the intermediate electrode 610 including the lower portion 611 and the upper portion 612, the liner insulating layer 710, the upper interlayer insulating layer 800 including the upper via-hole 800v, and an upper electrode 920.

The upper electrode 920 may be disposed in the upper via-hole 800v. The upper electrode 920 may include an upper metal pattern 921, an upper barrier pattern 922, and an upper conductive pattern 923.

The upper metal pattern 921 may be disposed close to the intermediate electrode 610. The upper metal pattern 921 may be in direct contact with an upper surface of the upper portion 612. The upper metal pattern 921 may extend along sidewalls of the upper via-hole 800v. For example, the upper metal pattern 921 may be in a U shape.

The upper metal pattern 921 may include a metal used for a silicide process of forming the intermediate electrode 610. For example, the upper metal pattern 921 may include Co, Ni, Ta, or Ti.

The upper barrier pattern 922 may be interposed between the upper conductive pattern 923 and the upper metal pattern 921. For example, the upper barrier pattern 922 may be in a U shape.

FIGS. 11A to 11M are cross-sectional views illustrating stages in a method of forming a semiconductor device according to an embodiment.

Figure 11A:
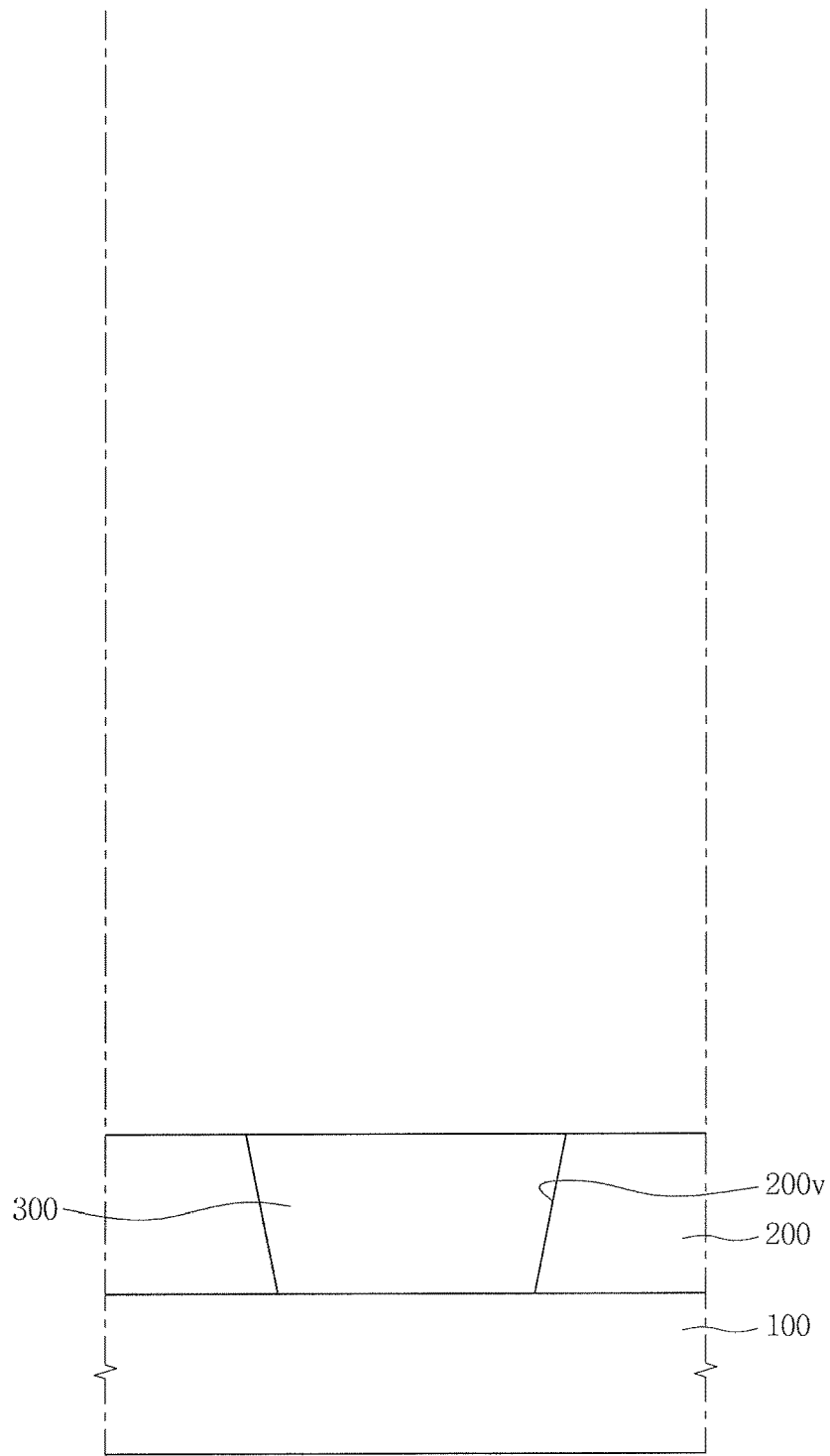
FIGS. 11A to 11M illustrate views of stages in a method of forming a semiconductor device according to one embodiment.

First, as shown in FIG. 11A, the method of forming the semiconductor device according to the embodiment may include a process of forming the lower interlayer insulating layer 200 including the lower via-hole 200v on the substrate 100 and a process of forming the lower electrode 300 in the lower via-hole 200v.

The process of forming the lower electrode 300 may include a process of forming a conductive layer, which fills the lower via-hole 200v, on the lower interlayer insulating layer 200, and a process of planarizing the conductive layer to expose an upper surface of the lower interlayer insulating layer 200. The process of planarizing the conductive layer may include a chemical mechanical polishing (CMP) process.

Figure 11B:
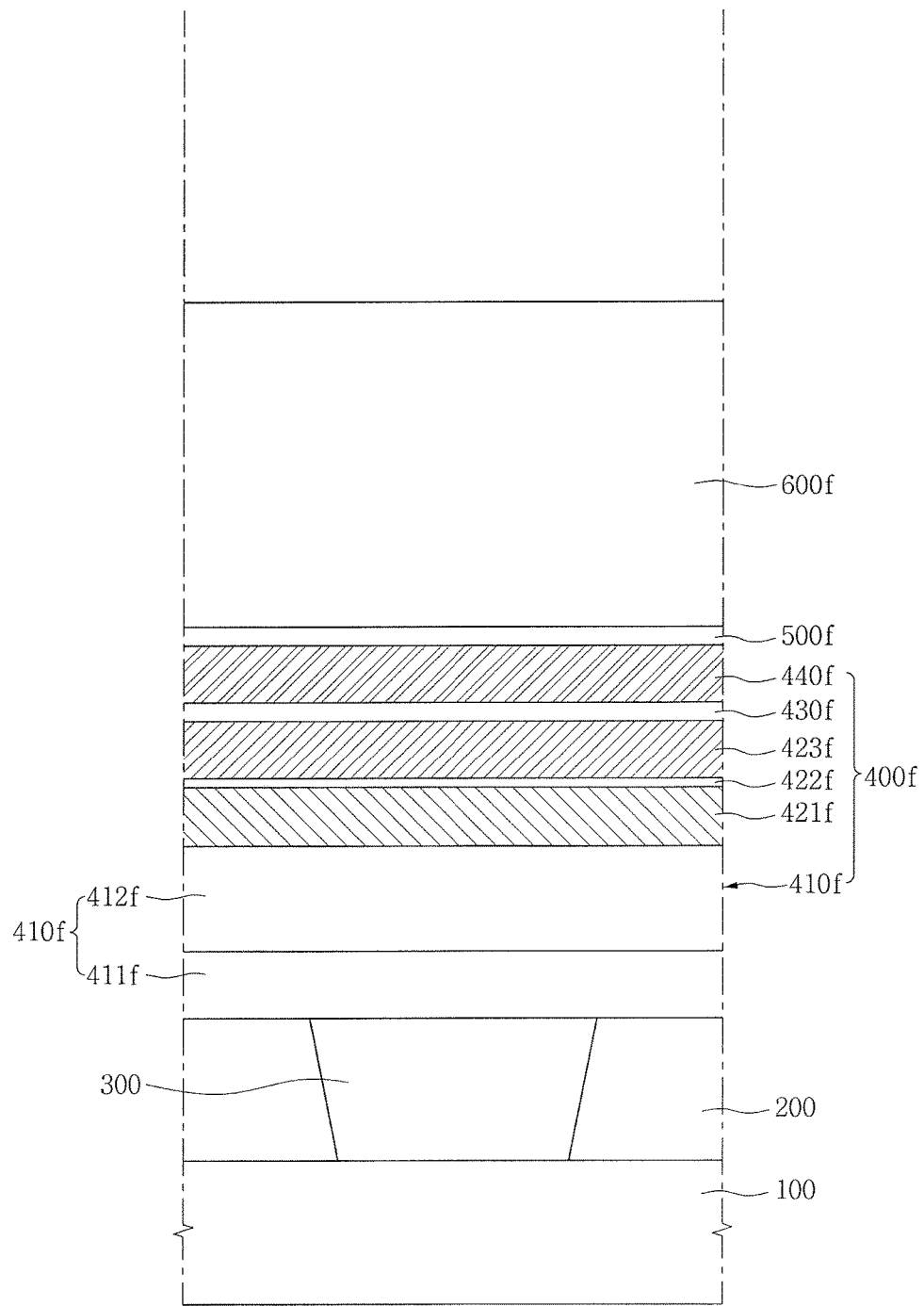

As shown in FIG. 11B, the method of forming the semiconductor device according to the embodiment may include a process of forming a magnetic tunnel junction layer 400f on the lower interlayer insulating layer 200 and the lower electrode 300, a process of forming a capping layer 500f on the magnetic tunnel junction layer 400f, and a process of forming a poly-silicon layer 600f on the capping layer 500f.

The process of forming the magnetic tunnel junction layer 400f may include a process of forming a seed layer 410f on the lower interlayer insulating layer 200 and the lower electrode 300, a process of forming a lower fixed magnetic layer 421f on the seed layer 410f, a process of forming a spacer layer 422f on the lower fixed magnetic layer 421f, a process of forming an upper fixed magnetic layer 423f on the spacer layer 422f, a process of forming a tunnel barrier layer 430f on the upper fixed magnetic layer 423f, and a process of forming a free magnetic layer 440f on the tunnel barrier layer 430f.

The process of forming the seed layer 410f may include a process of forming an amorphous seed layer 411f and a process of forming a crystalline structural seed layer 412f on the amorphous seed layer 411f.

The process of forming the upper fixed magnetic layer 423f and the process of forming the free magnetic layer 440f may include a process of forming a preliminary upper fixed magnetic layer in an amorphous state and a preliminary free magnetic layer in an amorphous state and a process of annealing the preliminary upper fixed magnetic layer and the preliminary free magnetic layer.

The poly-silicon layer 600f may include impurities to increase physical strength. For example, the poly-silicon layer 600f may include carbon.

Figure 11C:
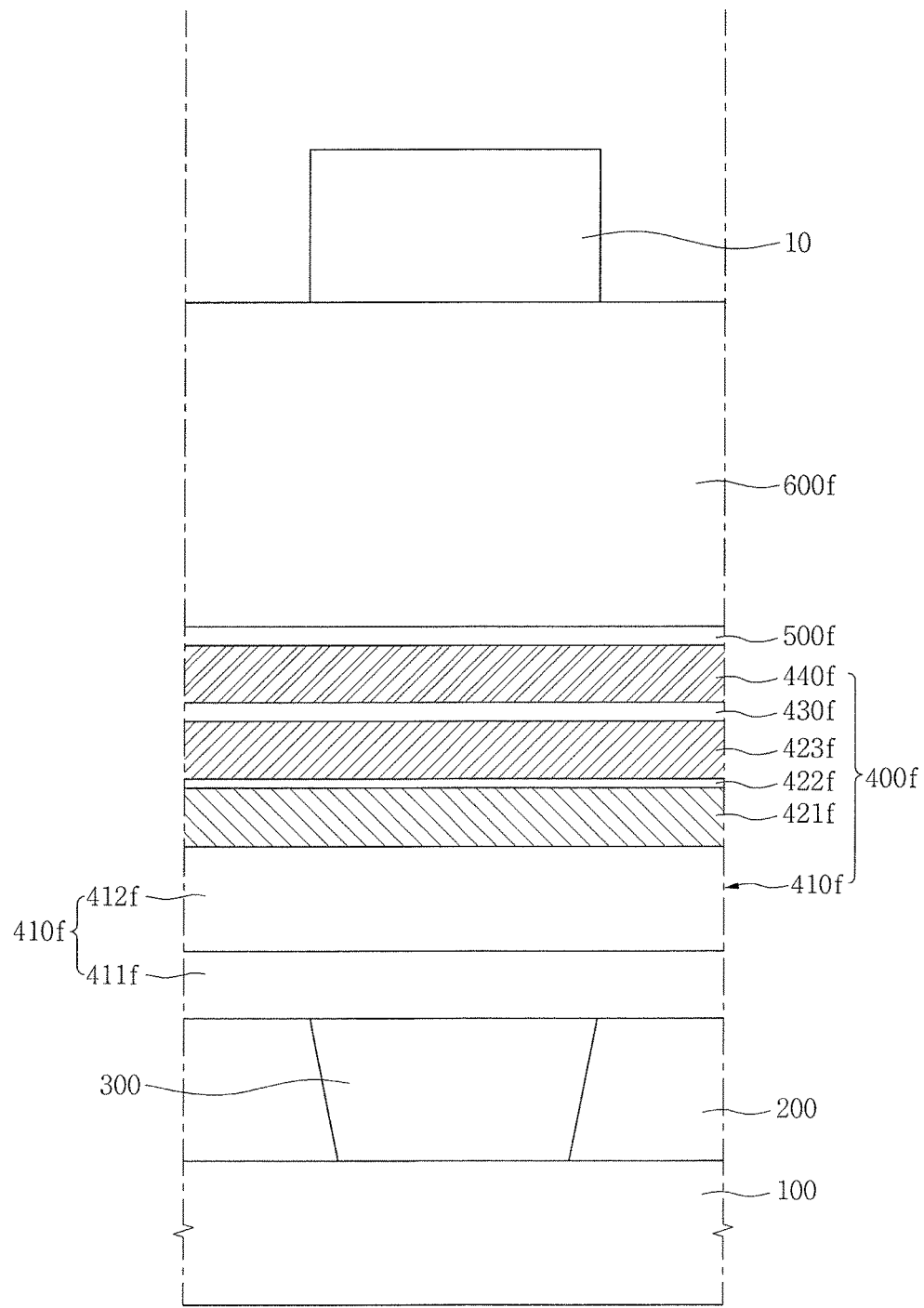

As shown in FIG. 11C, the method of forming the semiconductor device according to the embodiment may include a process of forming a mask pattern 10 on the poly-silicon layer 600f.

The process of forming the mask pattern 10 may include a process of forming a mask layer including an oxide or nitride on the poly-silicon layer 600f and a process of patterning the mask layer.

The mask pattern 10 may be formed above the lower electrode 300, e.g., the mask pattern 10 may overlap and be aligned with the lower electrode 300. For example, a horizontal width of the mask pattern 10 may be formed to be greater than that of an uppermost end of the lower electrode 300.

Figure 11D:
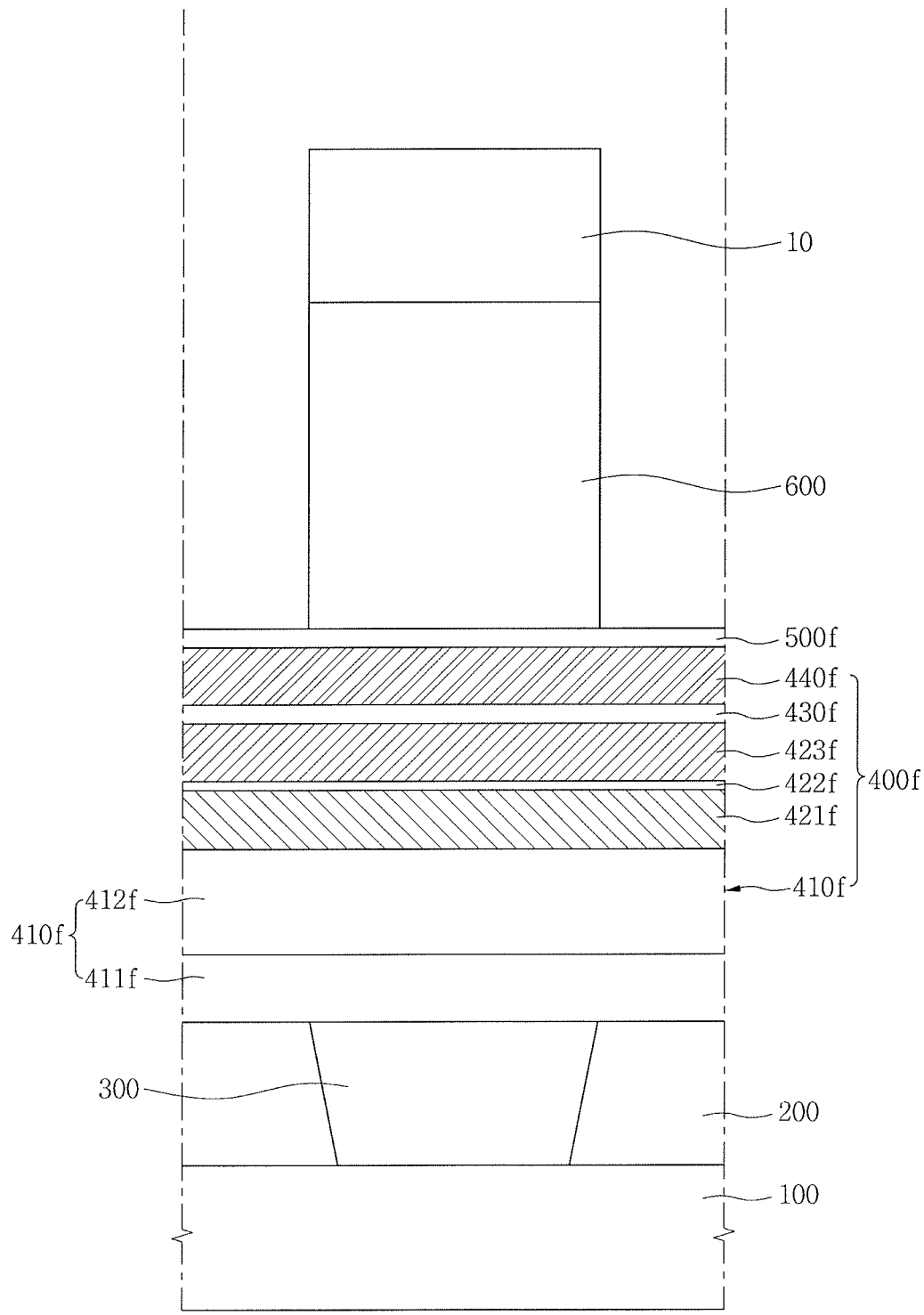

As shown in FIG. 11D, the method of forming the semiconductor device according to the embodiment may include a process of forming a hard mask pattern 600 on the magnetic tunnel junction layer 400f. The process of forming the hard mask pattern 600 may include a process of patterning the poly-silicon layer 600f using the mask pattern 10 as an etching mask to form a poly-silicon hard mask pattern 600.

Figure 11E:
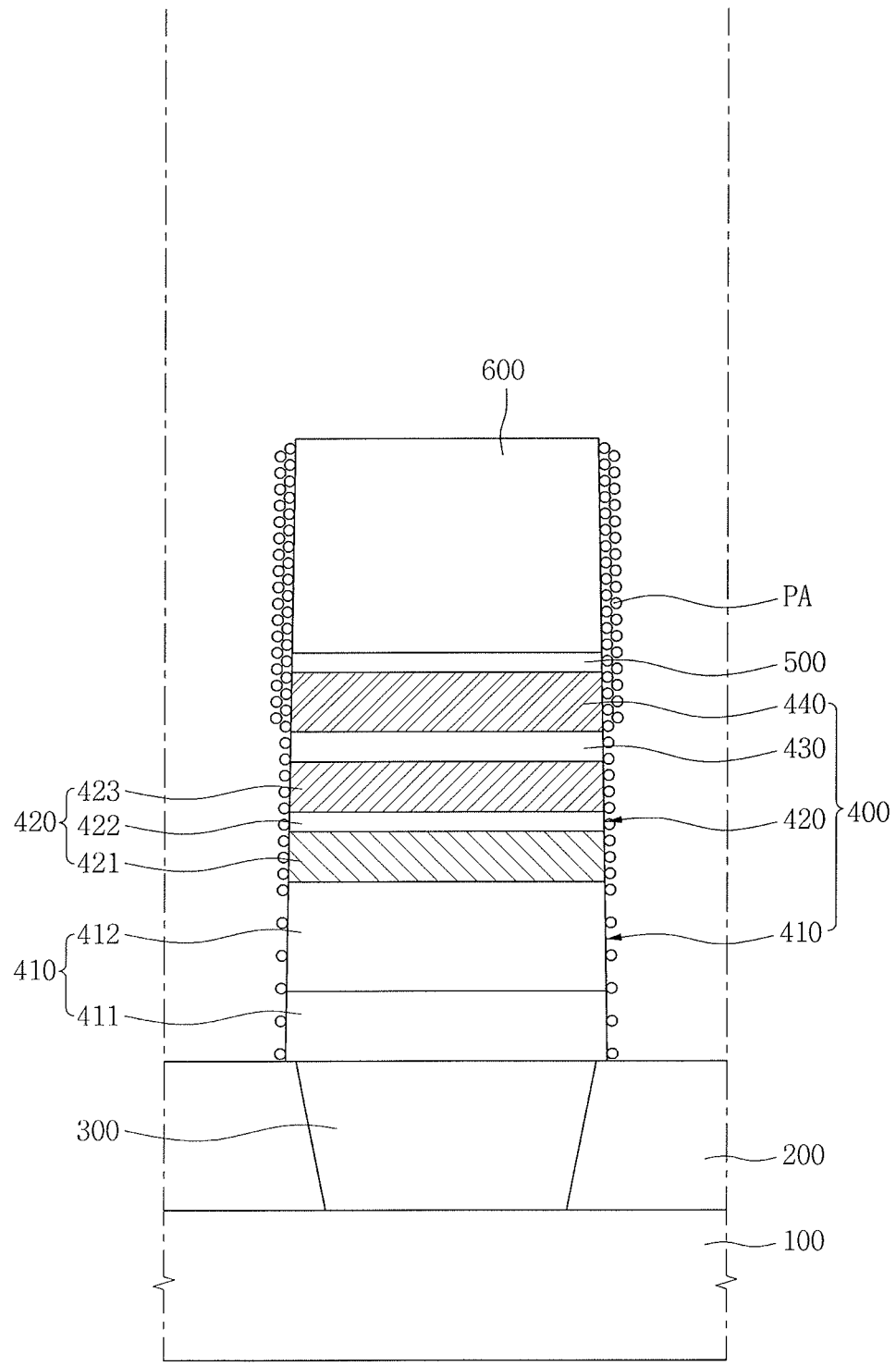

As shown in FIG. 11E, the method of forming the semiconductor device according to the embodiment may include a process of forming the magnetic tunnel junction structure 400 and the capping pattern 500 on the lower electrode 300.

The process of forming the magnetic tunnel junction structure 400 and the capping pattern 500 may include a process of sequentially patterning the capping layer 500f and the magnetic tunnel junction layer 400f using the hard mask pattern 600 as an etching mask. Side surfaces of the capping pattern 500 may be vertically aligned with side surfaces of the hard mask pattern 600, respectively. Side surfaces of the magnetic tunnel junction structure 400 may be vertically aligned with the side surfaces of the capping pattern 500, respectively. It is noted that two side surfaces that are vertically aligned refer to two surface that are collinear (as viewed in a cross-sectional view) to define a single, unbroken straight line.

The process of forming the magnetic tunnel junction structure 400 may include a process of sequentially patterning the free magnetic layer 440f, the tunnel barrier layer 430f, the upper fixed magnetic layer 423f, the spacer layer 422f, the lower fixed magnetic layer 421f, and the seed layer 410f. The magnetic tunnel junction structure 400 may include the seed pattern 410, the fixed magnetic pattern 420, the tunnel barrier pattern 430, and the free magnetic pattern 440. The fixed magnetic pattern 420 may include the lower fixed magnetic layer 421, the spacer 422, and the upper fixed magnetic layer 423. Side surfaces of the tunnel barrier pattern 430 may be vertically aligned with side surfaces of the free magnetic pattern 440, respectively. Side surfaces of the upper fixed magnetic layer 423 may be vertically aligned with the side surfaces of the tunnel barrier pattern 430, respectively. Side surfaces of the spacer 422 may be vertically aligned with the side surfaces of the upper fixed magnetic layer 423, respectively. Side surfaces of the lower fixed magnetic layer 421 may be vertically aligned with the side surfaces of the spacer 422, respectively. Side surfaces of the seed pattern 410 may be vertically aligned with the side surfaces of the lower fixed magnetic layer 421, respectively.

The process of patterning the seed layer 410f may include a process of sequentially patterning the crystalline structural seed layer 412f and the amorphous seed layer 411f. The seed pattern 410 may include the amorphous seed layer 411 and the crystalline structural seed layer 412. Side surfaces of the amorphous seed layer 411 may be vertically aligned with side surfaces of the crystalline structural seed layer 412, respectively.

The process of patterning the magnetic tunnel junction layer 400f may include a physical etching process. For example, the process of patterning the magnetic tunnel junction layer 400f may include an ion beam etch (IBE) process. The mask pattern 10 may be removed by the process of patterning the magnetic tunnel junction layer 400f. A thickness of the hard mask pattern 600 may become small by the process of patterning the magnetic tunnel junction layer 400f.

Side surfaces of the magnetic tunnel junction structure 400, the capping pattern 500, and the hard mask pattern 600 may be sloped. For example, a horizontal width of an uppermost end of the magnetic tunnel junction structure 400 may be smaller than that of a lowermost end of the magnetic tunnel junction structure 400. A horizontal width of an uppermost end of the capping pattern 500 may be smaller than that of a lowermost end of the capping pattern 500. A horizontal width of an uppermost end of the hard mask pattern 600 may be smaller than that of a lowermost end of the hard mask pattern 600.

As illustrated in FIG. 11E, during etching of the magnetic tunnel junction layer 400f, etching by-products PA may be deposited on the side surfaces of the magnetic tunnel junction structure 400 and the hard mask pattern 600. For example, etching by-products PA of the hard mask pattern 600 etched by a physical etching process during formation of the magnetic tunnel junction structure 400 may be deposited on the side surfaces of the magnetic tunnel junction structure 400 and the hard mask pattern 600. For example, as the hard mask pattern 600 is formed of poly-silicon, the etching by-products PA may include poly-silicon.

An amount of the deposited etching by-products PA may be increased in a direction opposite the substrate 100. For example, as further illustrated in FIG. 11E, the amount of the etching by-products PA deposited on the side surfaces of the hard mask pattern 600 may be greater than that deposited on the side surface of the seed pattern 410.

Figure 11F:
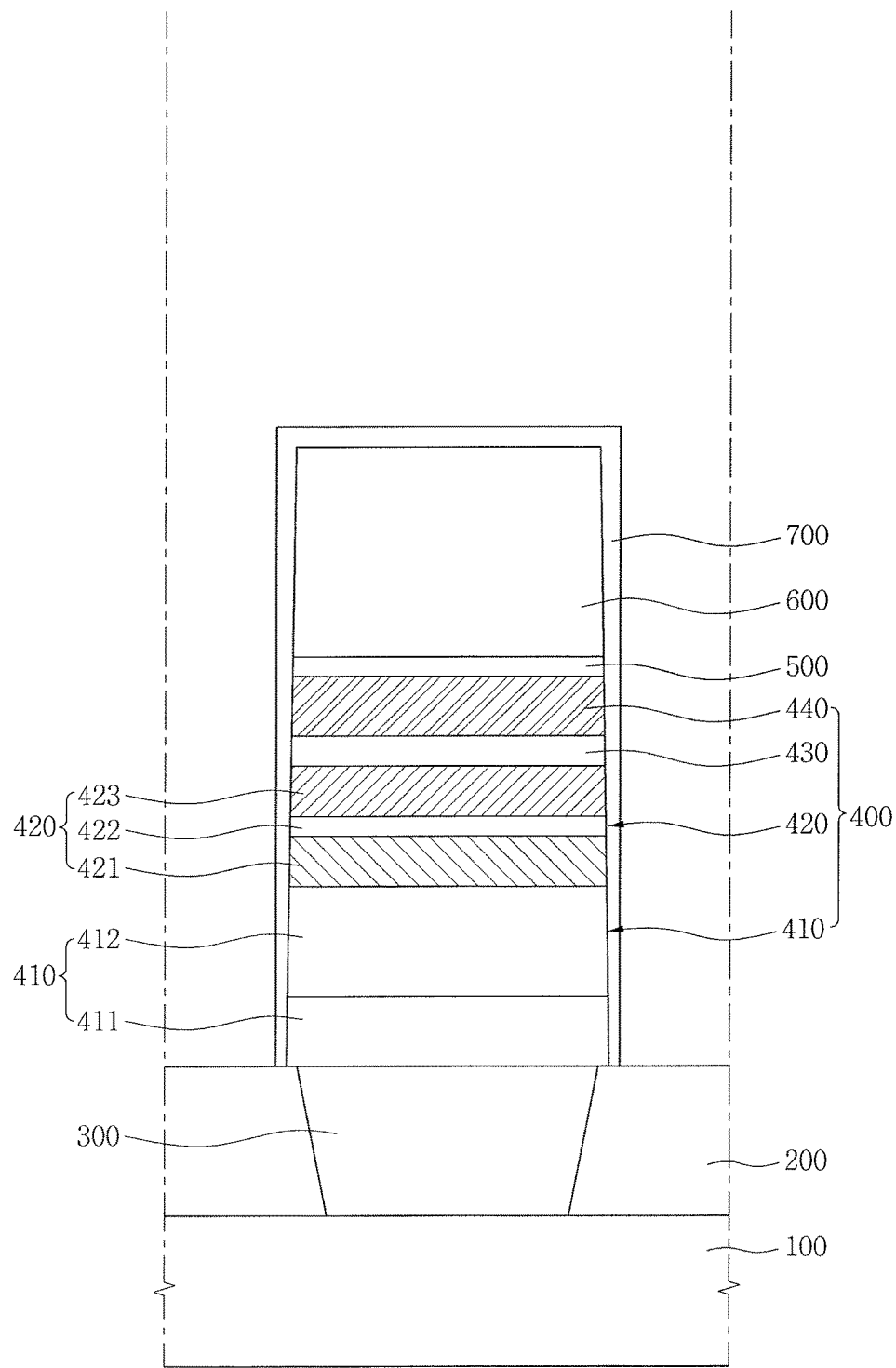

As shown in FIG. 11F, the method of forming the semiconductor device according to the embodiment may include a process of oxidizing the etching by-products PA to form a by-product oxide layer 700. As the etching by-products PA include poly-silicon, in the method of forming the semiconductor device according to the embodiment, the etching by-products PA may be quickly oxidized, e.g., as compared to metal etching by-products. Accordingly, in the method of forming the semiconductor device according to the embodiment, degradation of the magnetic tunnel junction structure 400 may be prevented in the process of oxidizing the etching by-products PA.

Figure 11G:
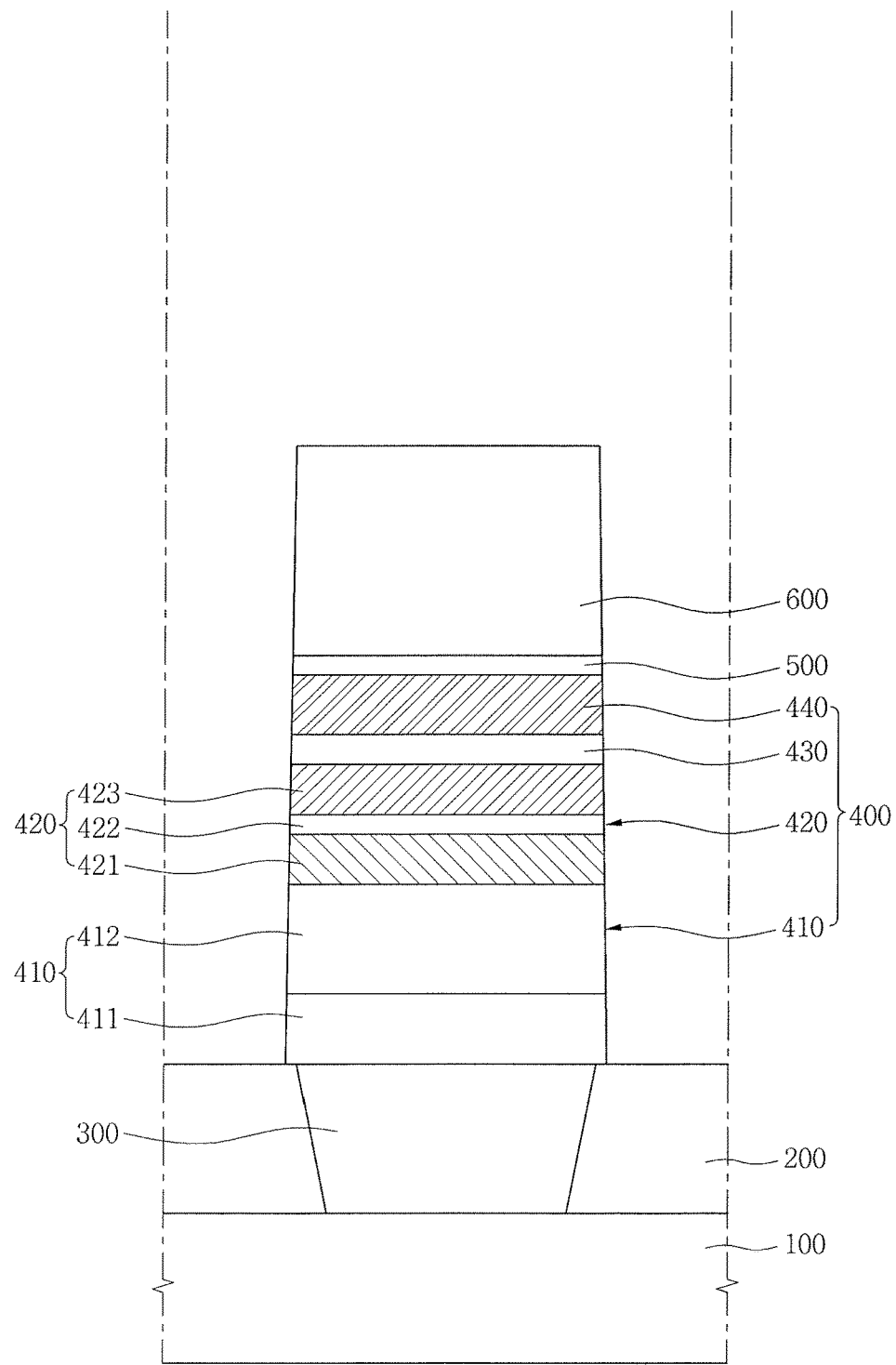

As shown in FIG. 11G, the method of forming the semiconductor device according to the embodiment may include a process of removing the by-product oxide layer 700.

Figure 11H:
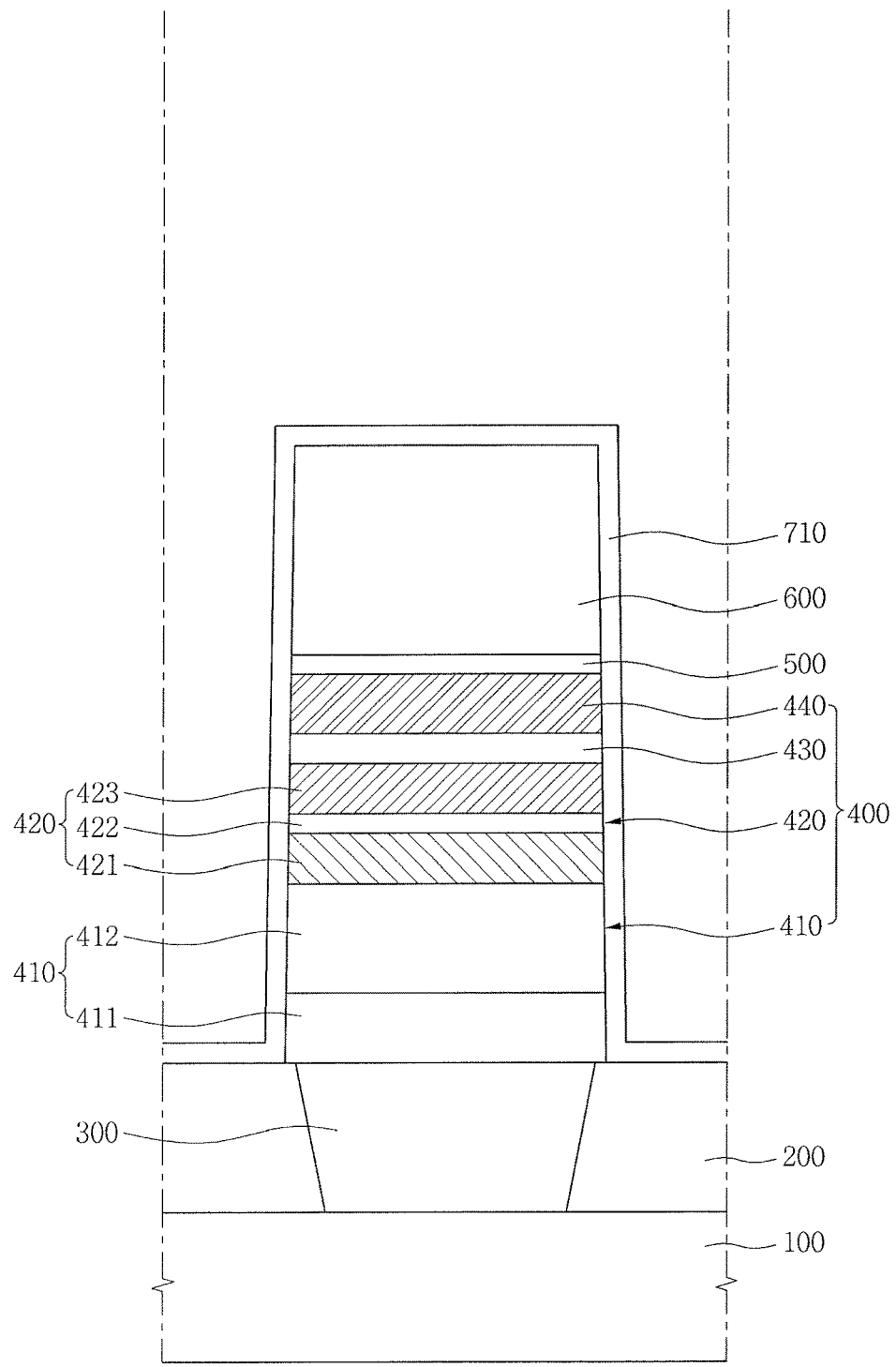

As shown in FIG. 11H, the method of forming the semiconductor device according to the embodiment may include a process of forming the liner insulating layer 710 on the substrate 100 from which the by-product oxide layer 700 is removed. The liner insulating layer 710 may be formed to have a predetermined thickness along an upper surface of the substrate 100, side surfaces of the magnetic tunnel junction structure 400, and a surface of the hard mask pattern 600.

In the method of forming the semiconductor device according to the embodiment, the process of forming the liner insulating layer 710 and the process of removing the by-product oxide layer 700 may be performed in situ. Thus, in the method of forming the semiconductor device according to the embodiment, unexpected oxidation of surfaces of the magnetic tunnel junction structure 400 and the hard mask pattern 600 may be prevented.

Figure 11I:
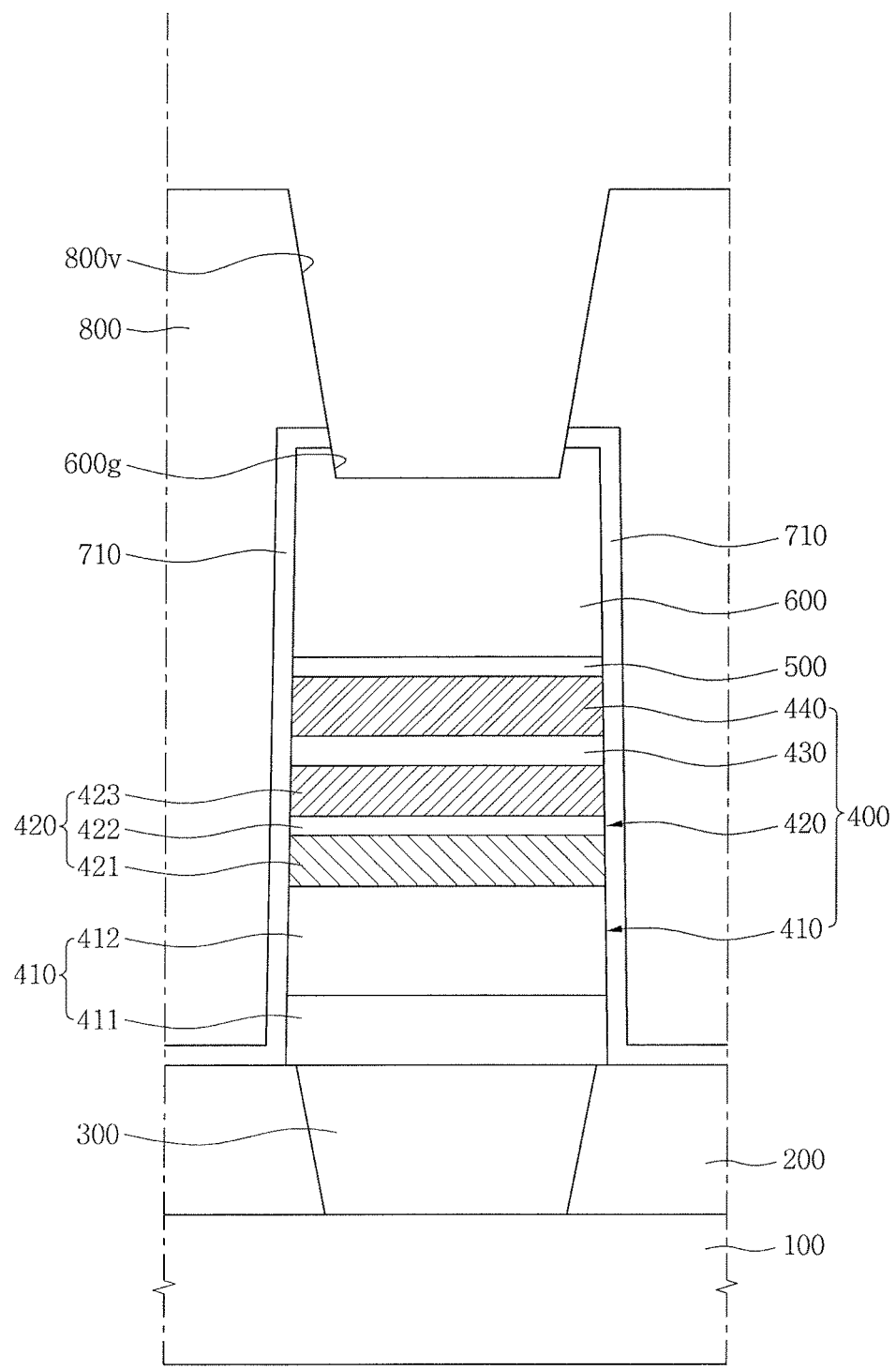

As shown in FIG. 11I, the method of forming the semiconductor device according to the embodiment may include a process of forming the upper interlayer insulating layer 800 on the liner insulating layer 710, and a process of forming he upper via-hole 800v in the upper interlayer insulating layer 800.

The magnetic tunnel junction structure 400 and the hard mask pattern 600 may be covered by the upper interlayer insulating layer 800. The upper interlayer insulating layer 800 may have etching selectivity with respect to the liner insulating layer 710. For example, the liner insulating layer 710 may be formed of silicon nitride, and the upper interlayer insulating layer 800 may be formed of silicon oxide.

The process of forming the upper via-hole 800v may include a process of partially exposing an upper surface of the hard mask pattern 600. For example, the process of forming the upper via-hole 800v may include a process of removing the liner insulating layer 710 and the upper interlayer insulating layer 800 disposed on the hard mask pattern 600.

The process of forming the upper via-hole 800v may include a process of forming the recessed portion 600g in an upper portion of the hard mask pattern 600. Sidewalls of the recessed portion 600g may be vertically aligned with sidewalls of the upper via-hole 800v, respectively.

Sidewalls of the upper via-hole 800v may be sloped. For example, a horizontal width of the upper via-hole 800v may become small in a direction close to the hard mask pattern 600. The sidewall of the upper via-hole 800v may have a profile different from a side surface profile of the hard mask pattern 600.

Figure 11J:
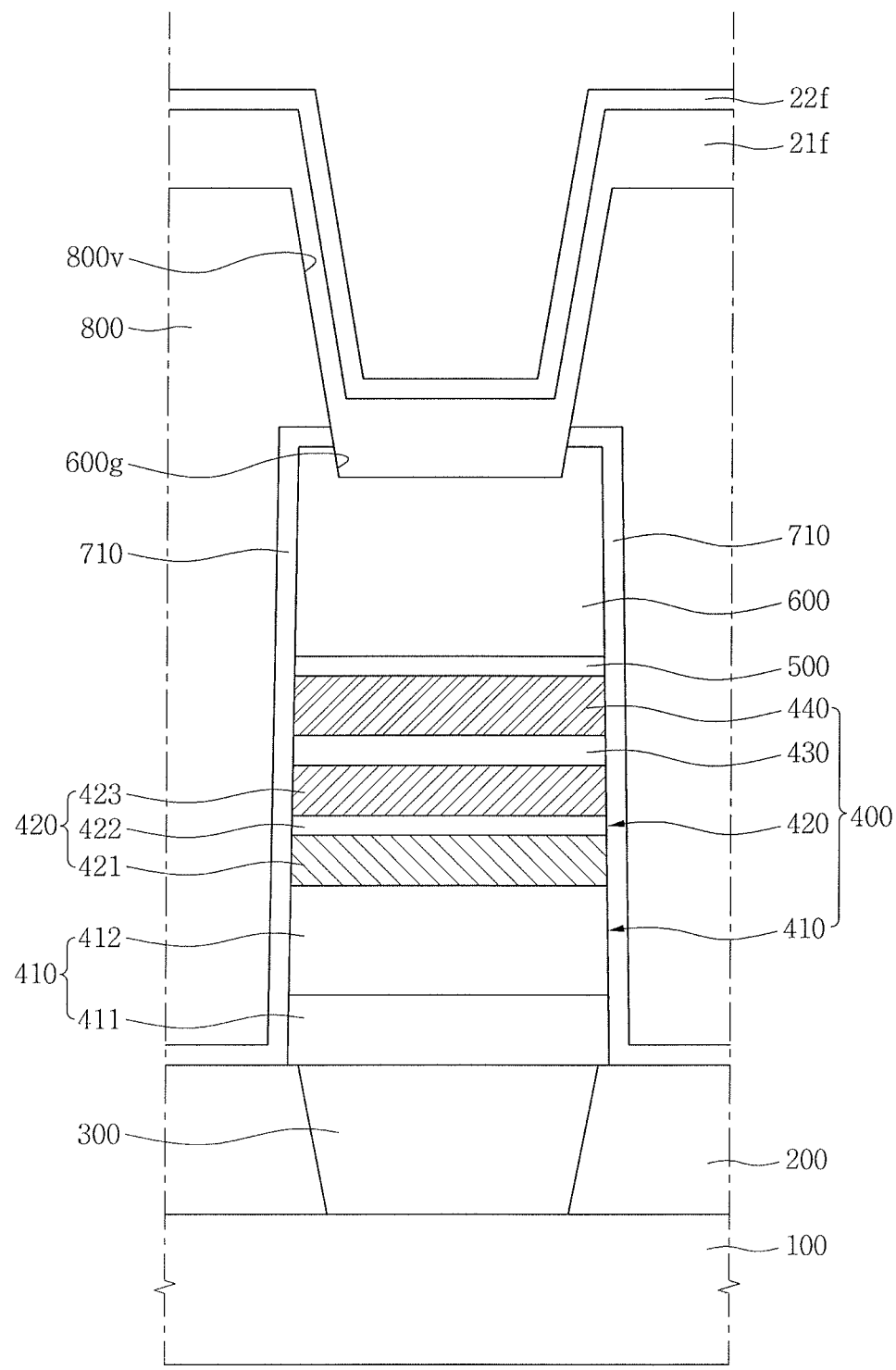

Referring to FIG. 11J, the method of forming the semiconductor device according to the embodiment may include a process of forming a metal layer 21f on the upper interlayer insulating layer 800 in which the upper via-hole 800v is formed, and a first barrier layer 22f on the metal layer 21f.

The process of forming the metal layer 21f may include a process of filling a metal into the recessed portion 600g of the hard mask pattern 600. The metal layer 21f may be formed to be thicker on an upper surface of the hard mask pattern 600 than on the sidewalls of the upper via-hole 800v. For example, the process of forming the metal layer 21f may include a chemical vapor deposition (CVD) process. The metal layer 21f may be formed of Co, Ni, Ta, or Ti. The first barrier layer 22f may be formed of a metal nitride.

Figure 11K:
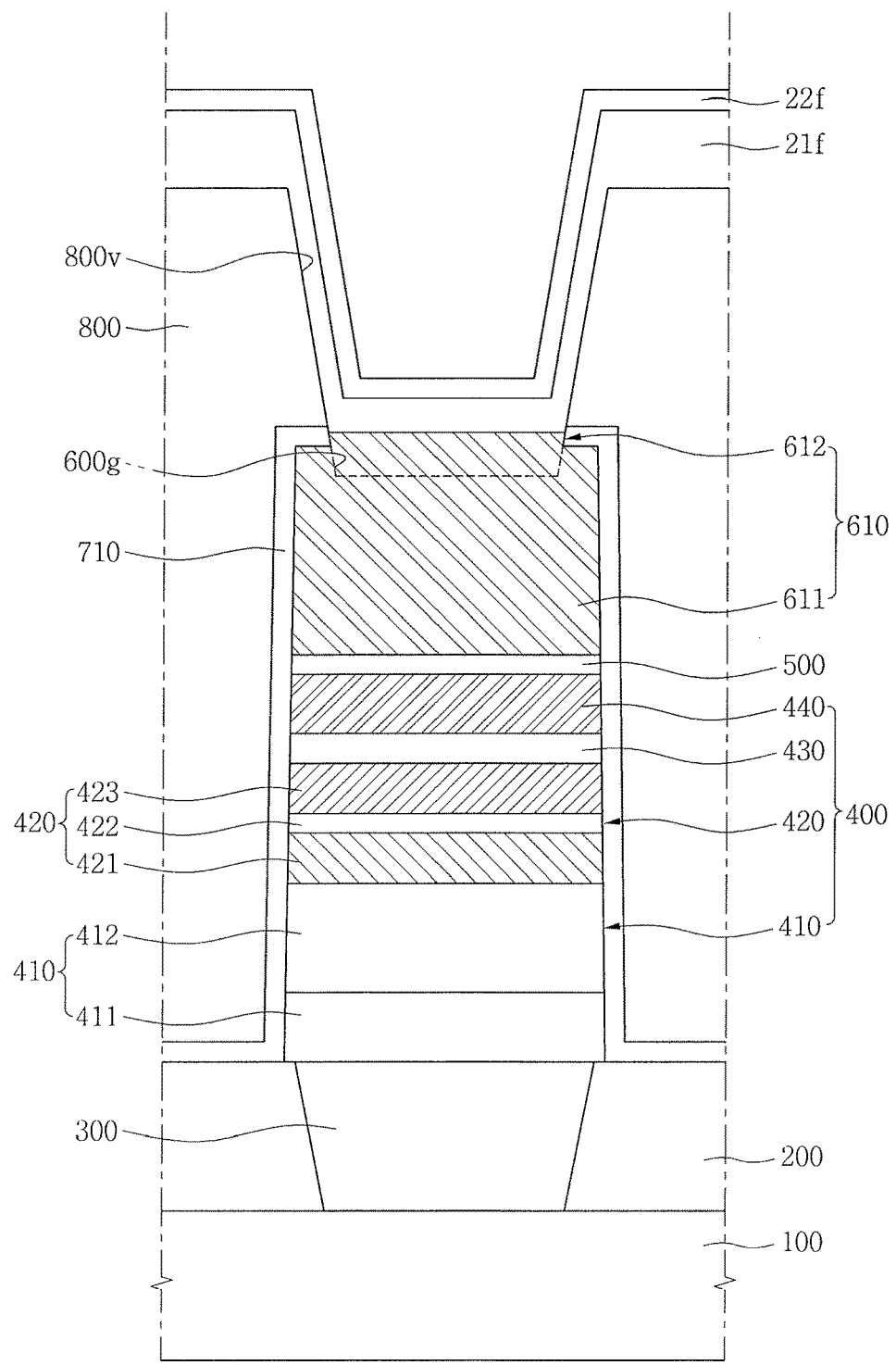

Referring to FIG. 11K, the method of forming the semiconductor device according to the embodiment may include a process of forming the intermediate electrode 610 on the magnetic tunnel junction structure 400 by a silicide process.

In detail, a part of the metal layer 21f disposed close to, e.g., in contact with, the hard mask pattern 600 may be converted into a metal silicide by the silicide process. For example, the process of forming the intermediate electrode 610 may include a process of converting a material of the entire hard mask pattern 600 and a part of the metal layer 21f into metal silicide to define the intermediate electrode 610.

The process of forming the intermediate electrode 610 may include a process of converting a material of the entire metal layer 21f, by which the recessed portion 600g of the hard mask pattern 600 is filled, into a metal silicide. For example, the intermediate electrode 610 may include the lower portion 611 having a same side surface profile as that of the magnetic tunnel junction structure 400, and the upper portion 612 having a different side surface profile from that of the lower portion 611.

The lower portion 611 may be disposed close to the magnetic tunnel junction structure 400. Side surfaces of the magnetic tunnel junction structure 400 may be vertically aligned with side surfaces of the lower portion 611, respectively.

The upper portion 612 may have a shape protruding from an uppermost end the lower portion 611. For example, the upper portion 612 may be disposed inside the upper via-hole 800v. Side surfaces of the upper portion 612 may have same profiles as those of sidewalls of the upper via-hole 800v. The side surfaces of the upper portion 612 may be vertically aligned with the sidewalls of the upper via-hole 800v, respectively.

Figure 11L:
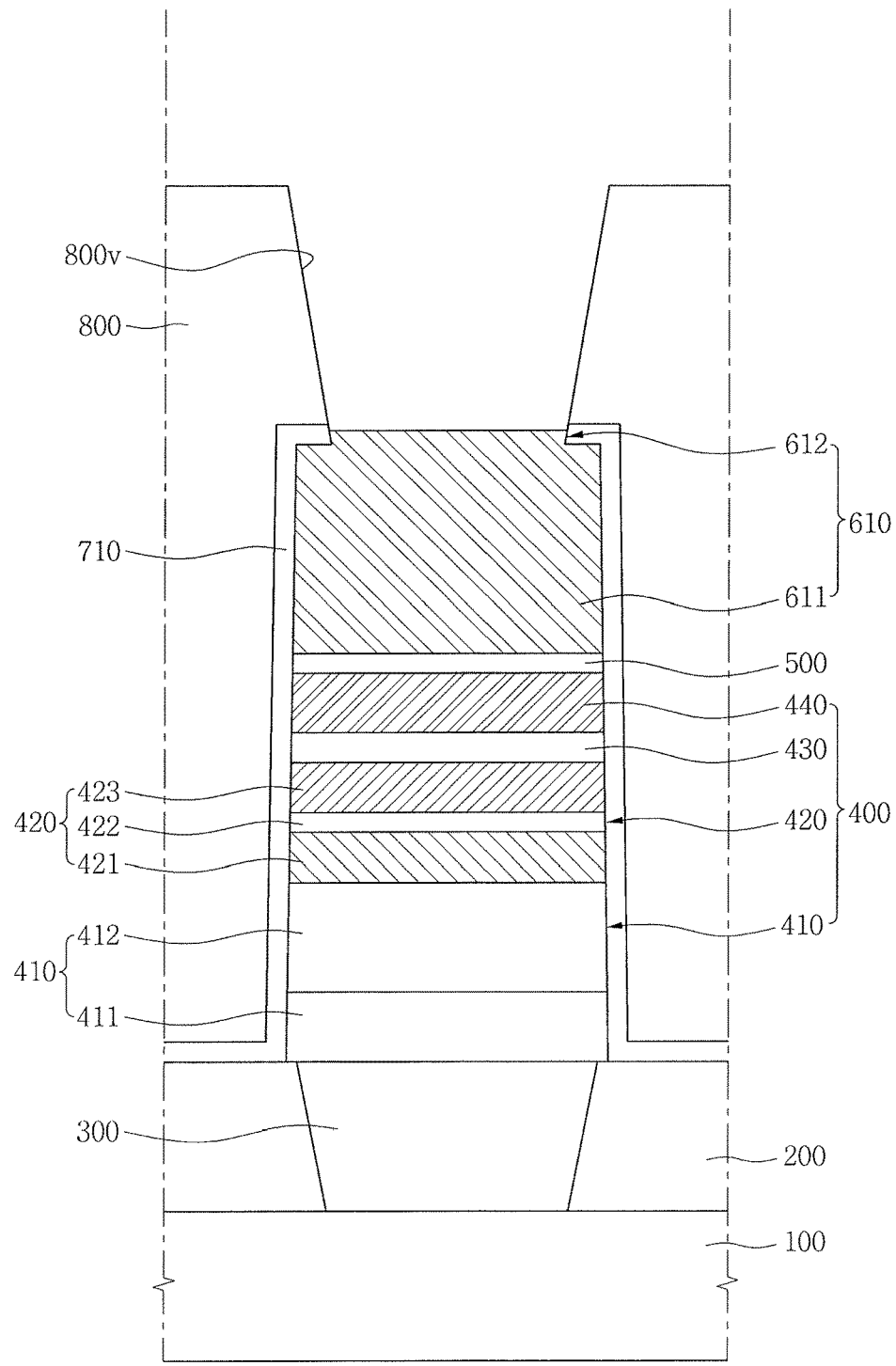

Referring to FIG. 11L, the method of forming the semiconductor device according to the embodiment may include a process of removing the metal layer 21f and the first barrier layer 22f which were not converted into the intermediate electrode 610.

Figure 11M:
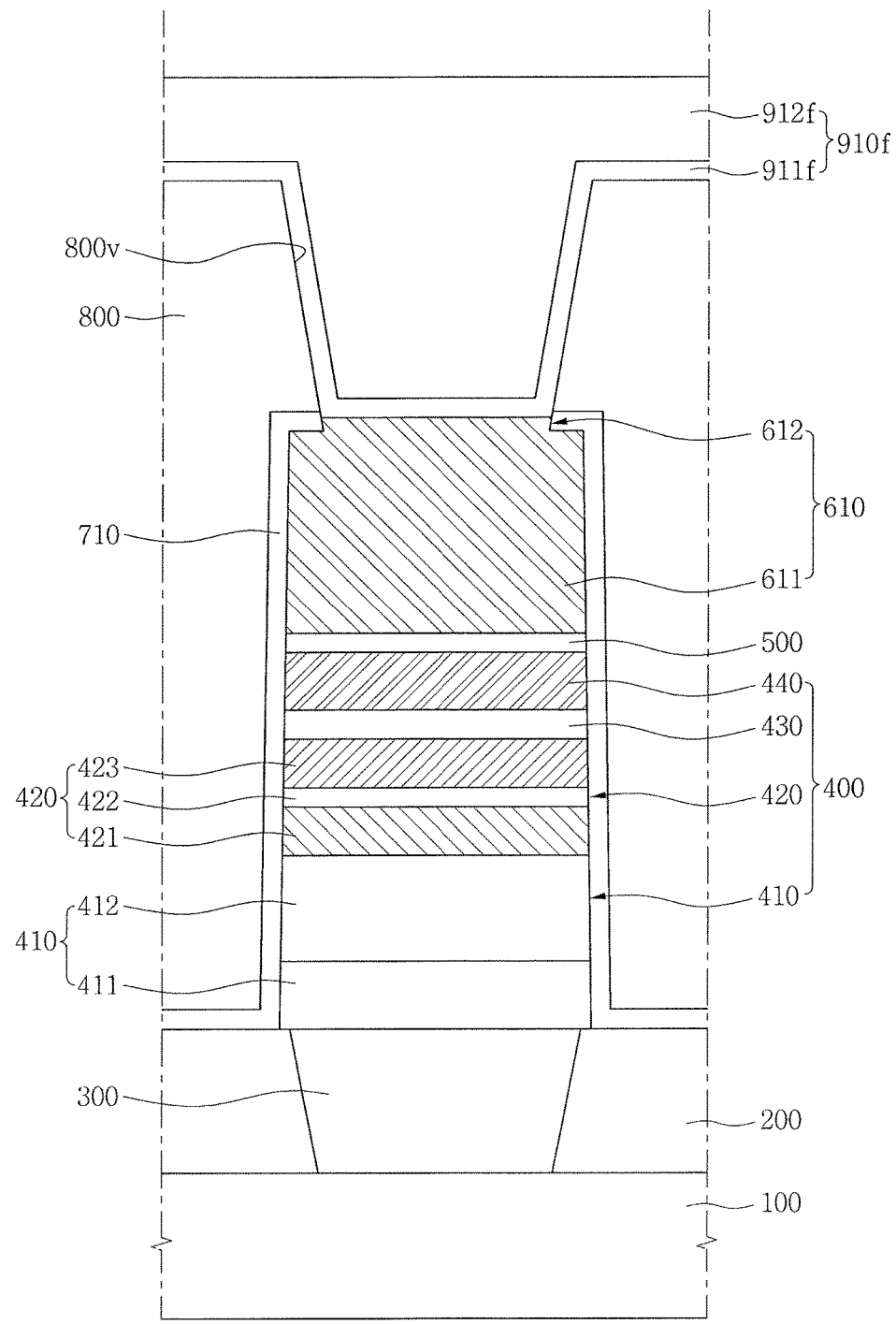

Referring to FIG. 11M, the method of forming the semiconductor device according to the embodiment may include forming, e.g., conformally, an upper barrier layer 911f in the upper via-hole 800v, and forming an upper conductive layer 912f on the upper barrier layer 911f to fill the upper via-hole 800v. Next, referring to FIG. 2, the method of forming the semiconductor device according to the embodiment may include processing the upper barrier layer 911f and the upper conductive layer 912f a to form the upper barrier pattern 911 and the upper conductive pattern 912, respectively, of the upper electrode 910 in the upper via-hole 800v.

In detail, the process of forming the upper electrode 910 may include a process of forming a second barrier pattern on the upper interlayer insulating layer 800 including the upper via-hole 800v which exposes an upper surface of the intermediate electrode 610, a process of forming a conductive layer on the second barrier pattern, and a process of patterning the second barrier pattern and the conductive layer so that an upper surface of the upper interlayer insulating layer 800 is exposed.

The upper electrode 910 may include the upper barrier pattern 911 and the upper conductive pattern 912. The upper barrier pattern 911 may be formed between the intermediate electrode 610 and upper interlayer insulating layer 800 and the upper conductive pattern 912. For example, the upper barrier pattern 911 may be formed in a U shape.

Side surfaces of the upper electrode 910 may have same profiles as those of side surfaces of the upper portion 612. The side surfaces of the upper portion 612 may be vertically aligned with the side surfaces of the upper electrode 910, respectively.

As a result, the method of forming the semiconductor device according to the embodiment may include a patterning process of forming a magnetic tunnel junction structure using a poly-silicon hard mask pattern. Further, in the method of forming the semiconductor device according to the embodiment, after the magnetic tunnel junction structure is formed, poly-silicon etching by-products of the hard mask pattern may be converted into a metal silicide. Thus, the method of forming the semiconductor device according to the embodiment may prevent an increase in an overall resistance value caused by using the hard mask pattern formed of poly-silicon. Accordingly, in the method of forming the semiconductor device according to the embodiment, a potential electrical short caused by etching by-products may be prevented without degradation of electromagnetic properties of the magnetic tunnel junction structure.

In addition, the method of forming the semiconductor device according to the embodiment easily controls a profile of the hard mask pattern because the hard mask pattern is formed of poly-silicon. Accordingly, the method of forming the semiconductor device according to the embodiment may improve a dispersion of electromagnetic properties of the magnetic tunnel junction structures.

Figure 12A:
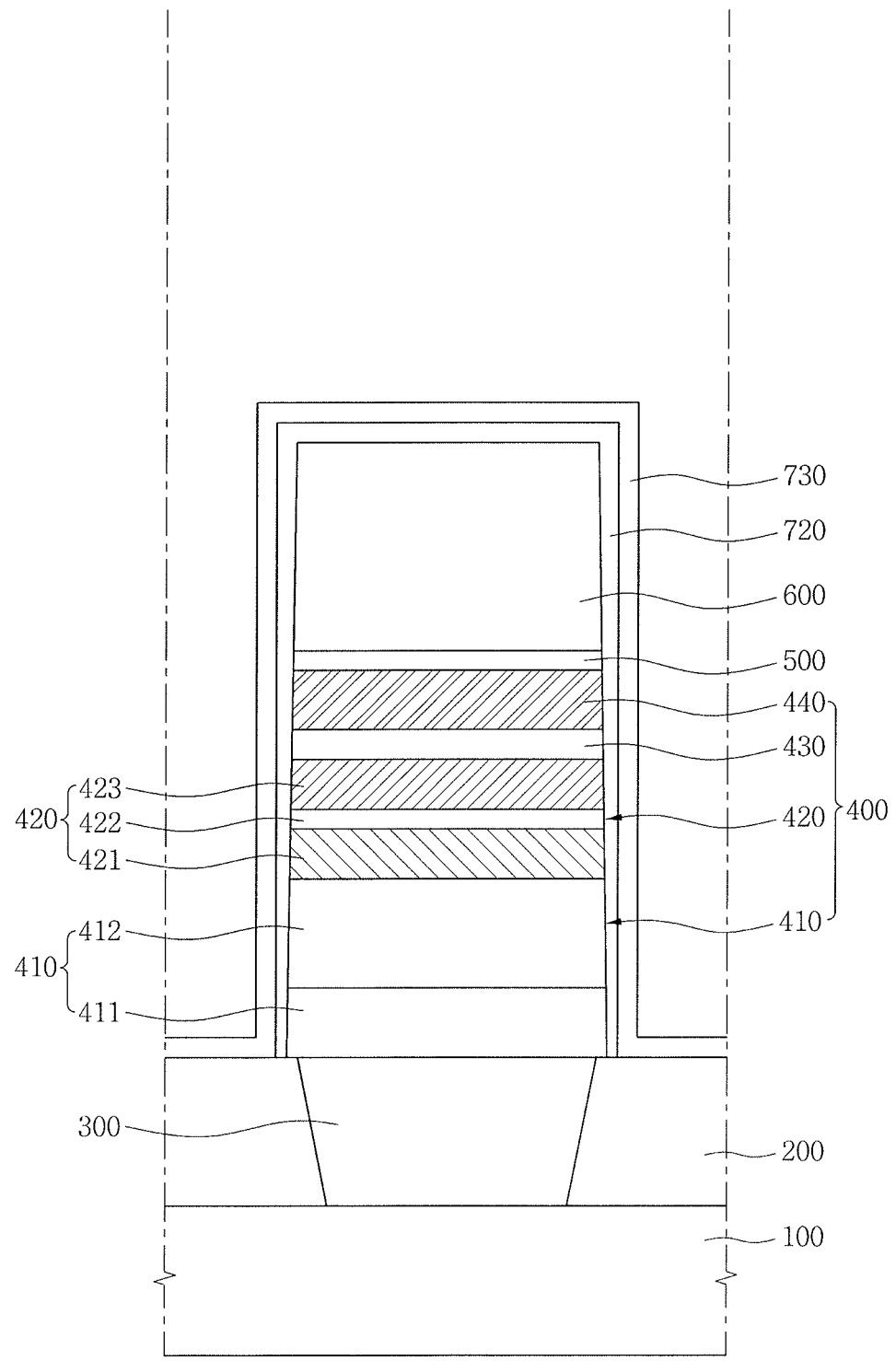
FIGS. 12A, 12B, 13A, 13B and 14 illustrate views of stages in a method of forming a semiconductor device according to another embodiment.
Figure 12B:
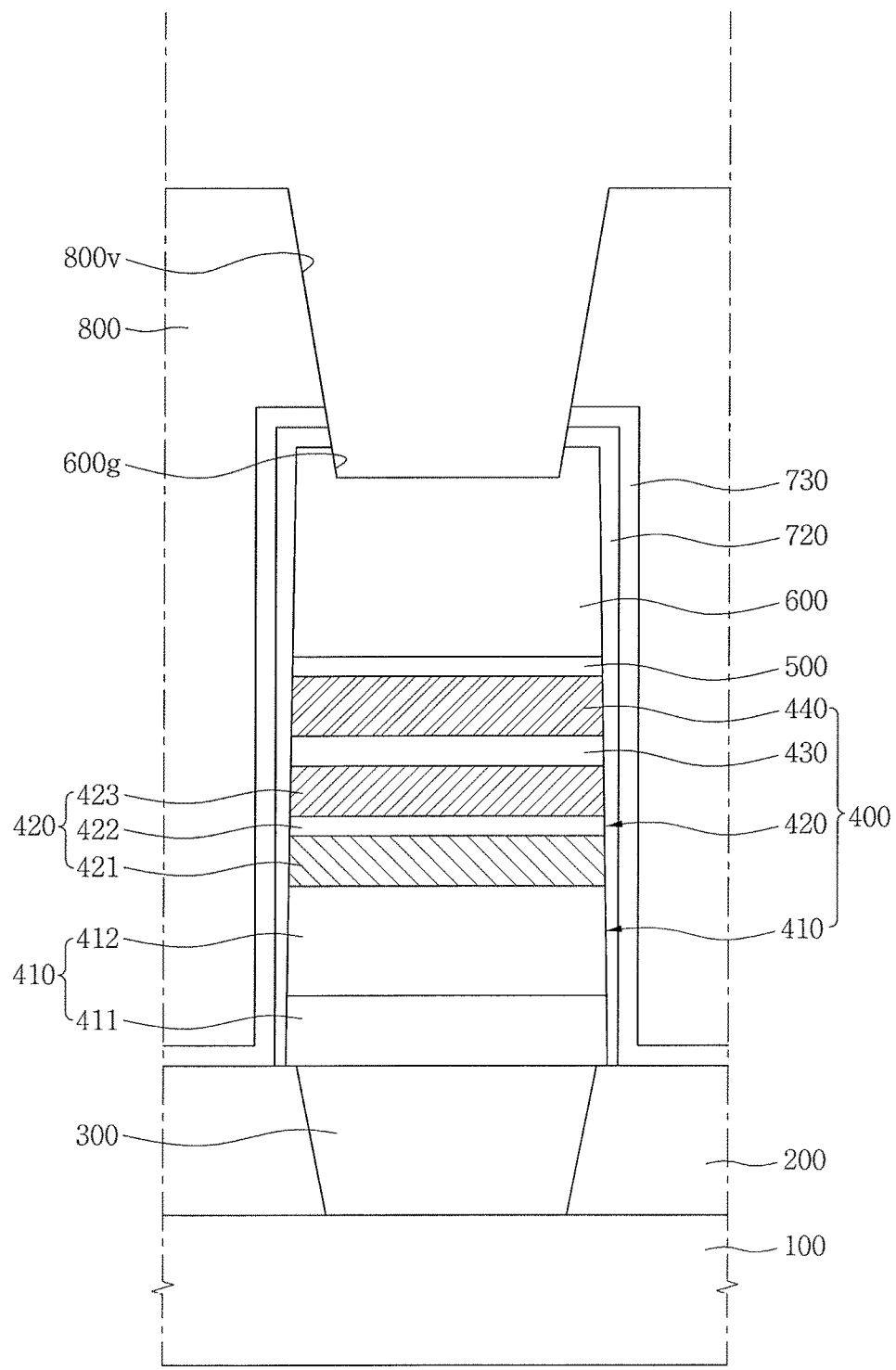

FIGS. 12A and 12B are views illustrating stages in a method of forming a semiconductor device according to an embodiment.

The method of forming the semiconductor device according to the embodiment will be described with reference to FIGS. 7, 12A, and 12B. First, as shown in FIG. 12A, the method of forming the semiconductor device according to the embodiment may include a process of forming the lower interlayer insulating layer 200 including the lower via-hole 200v on the substrate 100, a process of forming a lower electrode 300 in the lower via-hole 200v, a process of forming a magnetic tunnel junction structure 400 on the lower electrode 300 using the hard mask pattern 600 formed of poly-silicon, a process of forming the by-product oxide layer 720 on surfaces of the magnetic tunnel junction structure 400 and the hard mask pattern 600 through an oxidation process, and a process of forming the liner insulating layer 730 on the substrate 100 on which the by-product oxide layer 720 is formed.

Referring to FIG. 12B, the method of forming the semiconductor device according to the embodiment may include a process of forming the upper interlayer insulating layer 800 including the upper via-hole 800v, which exposes the upper surface of the hard mask pattern 600, on the liner insulating layer 730.

The process of forming the upper via-hole 800v may include a process of forming the recessed portion 600g in an upper portion of the hard mask pattern 600. For example, the process of forming the upper via-hole 800v may include a process of removing the by-product oxide layer 720, the liner insulating layer 730, and the upper interlayer insulating layer 800 which are disposed on the hard mask pattern 600.

Referring to FIG. 7, the method of forming the semiconductor device according to the embodiment may include a process of forming a metal layer in contact with an upper surface of the hard mask pattern 600 exposed by the upper via-hole 800v, a process of forming an intermediate electrode 610 by converting the entire hard mask pattern 600 and a part of the metal layer into metal silicide, a process of removing the metal layer not converted into the metal silicide layer, and a process of forming an upper electrode 910 on an upper surface of the intermediate electrode 610 exposed by the upper via-hole 800v.

Figure 13A:
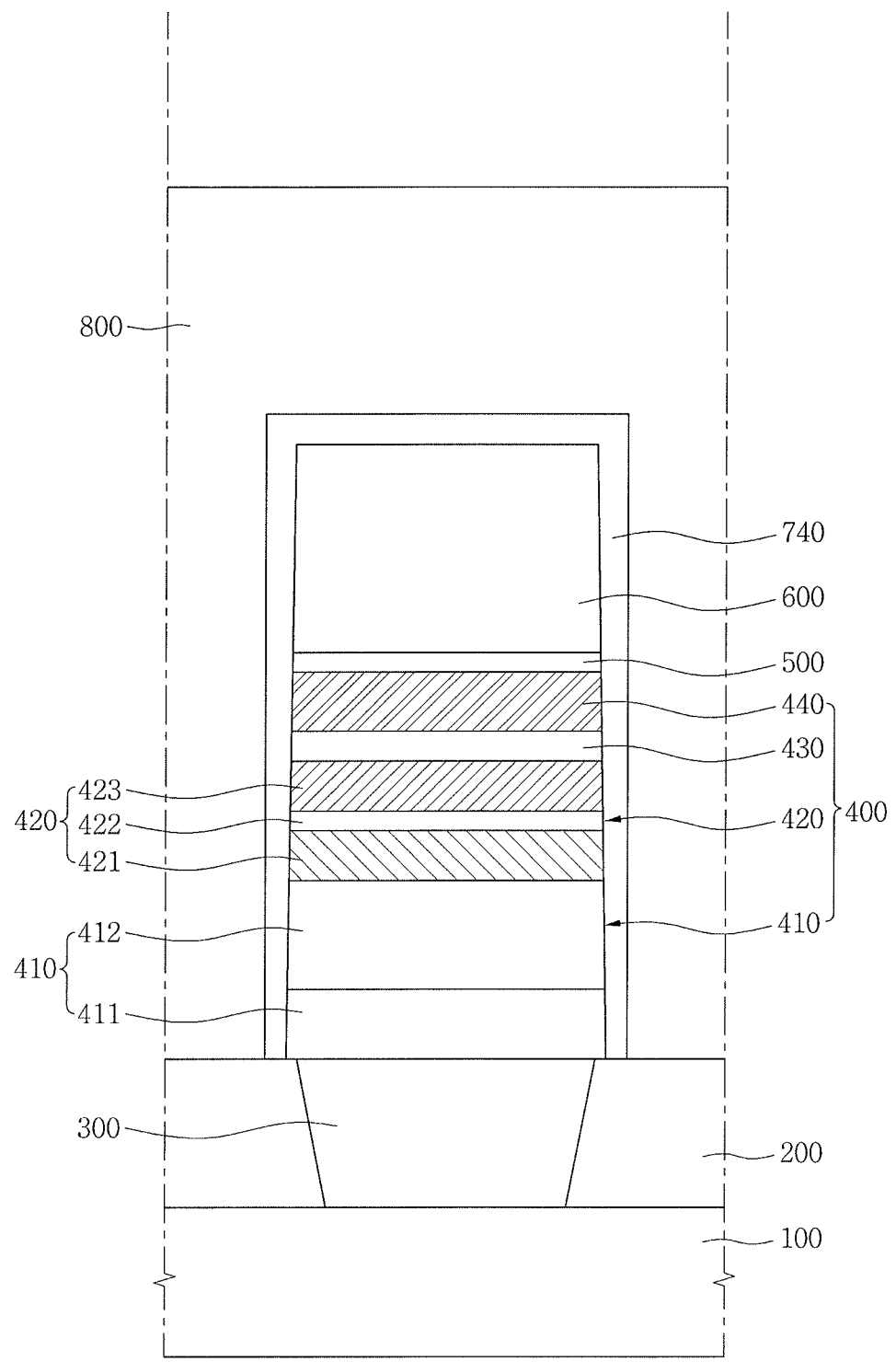
Figure 13B:
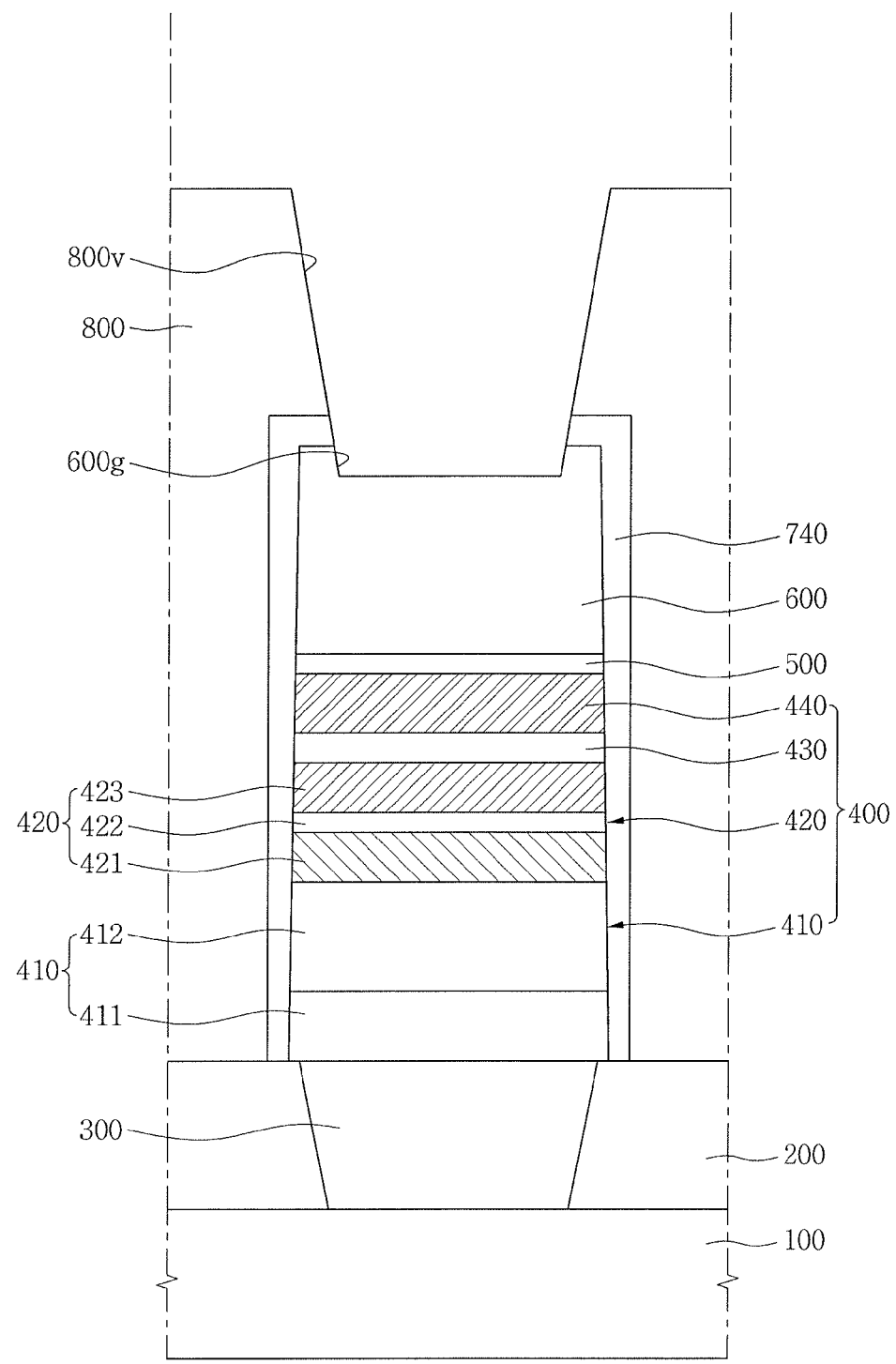

FIGS. 13A and 13B are views illustrating stages in a method of forming a semiconductor device according to an embodiment.

The method of forming the semiconductor device according to the embodiment will be described with reference to FIGS. 9, 13A, and 13B. First, as shown in FIG. 13A, the method of forming the semiconductor device according to the embodiment may include a process of forming a magnetic tunnel junction layer on the substrate 100 on which the lower interlayer insulating layer 200 and the lower electrode 300 are formed, a process of forming a magnetic tunnel junction structure 400 by patterning the magnetic tunnel junction layer using the hard mask pattern 600 formed of poly-silicon, a process of forming the by-product oxide layer 740 on surfaces of the magnetic tunnel junction structure 400 and the hard mask pattern 600 through an oxidation process, and a process of forming the upper interlayer insulating layer 800 on the substrate 100 on which the by-product oxide layer 740 is formed.

Referring to FIG. 13B, the method of forming the semiconductor device according to the embodiment may include a process of forming the upper via-hole 800v, which exposes the upper surface of the hard mask pattern 600, on the upper interlayer insulating layer 800.

The process of forming the upper via-hole 800v may include a process of forming the recessed portion 600g in the upper portion of the hard mask pattern 600. For example, the process of forming the upper via-hole 800v may include a process of removing the by-product oxide layer 740 and the upper interlayer insulating layer 800 which are disposed on the hard mask pattern 600.

Referring to FIG. 9, the method of forming the semiconductor device according to the embodiment may include a process of forming the intermediate electrode 610 and a process of forming the upper electrode 910 on the intermediate electrode 610, using the hard mask pattern 600.

Figure 14:
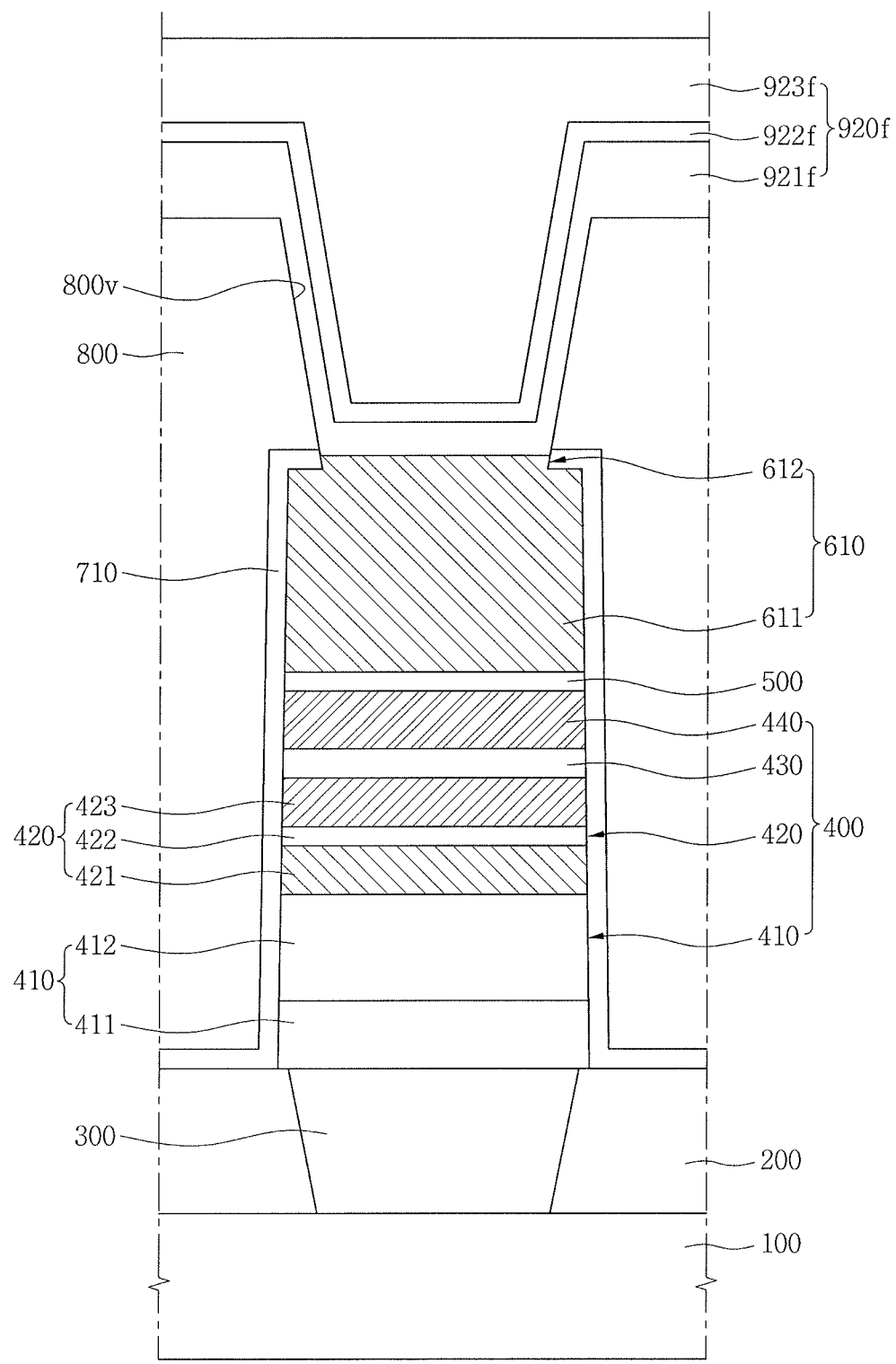

FIG. 14 is a view illustrating a method of forming a semiconductor device according to an embodiment.

The method of forming the semiconductor device according to the embodiment will be described with reference to FIGS. 10 and 14. First, as shown in FIG. 14, the method of forming the semiconductor device according to the embodiment may include a process of forming the substrate 100 including the lower interlayer insulating layer 200 and the lower electrode 300, a process of forming the magnetic tunnel junction structure 400 on the substrate 100 using a hard mask pattern formed of poly-silicon, a process of removing etching by-products generated by the process of forming the magnetic tunnel junction structure 400, a process of forming the liner insulating layer 710 on the substrate 100 on which etching by-products are removed, a process of forming the upper interlayer insulating layer 800 including the upper via-hole 800v on the liner insulating layer 710, a process of sequentially forming an upper metal layer 921f and an upper barrier layer 922f on the upper interlayer insulating layer 800, a process of forming an intermediate electrode 610 on the magnetic tunnel junction structure 400 through a silicide process using the upper metal layer 921f, and a process of forming an upper conductive layer 923f on the upper barrier layer 922f.

The upper metal layer 921f, the upper barrier layer 922f, and the upper conductive layer 923f, which do not react to the silicide process of forming the intermediate electrode 610, may form an upper electrode layer 9201.

Referring to FIG. 10, the method of forming the semiconductor device according to the embodiment may include a process of forming the upper electrode 920 in the upper via-hole 800v.

The process of forming the upper electrode 920 may include a process of planarizing the upper electrode layer 920f so that an upper surface of the upper interlayer insulating layer 800 is exposed.

As may be seen from the foregoing, the semiconductor device and the method of forming the same according to the embodiments may quickly oxidize etching by-products generated by a physical etching process. Thus, in the semiconductor device and the method of forming the same according to the embodiments, degradation of electromagnetic properties of the magnetic tunnel junction structure caused by a process of oxidizing the etching by-products may be prevented. Accordingly, in the semiconductor device and the method of forming the same according to the embodiments, reliability thereof may be improved.

By way of summation and review, during a physical etching process of a magnetic tunnel junction structure and the hard mask pattern thereon, etching by-products may be deposited on side surfaces of the magnetic tunnel junction structure and/or the hard mask pattern. Such deposition of the etching by-products may potentially cause an electrical short circuit.

Therefore, embodiments provide a semiconductor device capable of preventing an electrical short potentially caused by the etching by-products, without degradation of the electromagnetic properties of a magnetic tunnel junction structure. That is, during formation of the semiconductor device according to embodiments, a poly-silicon hard mask pattern may be used on the magnetic tunnel junction structure during etching. As such, when resultant etching by-products on side surfaces of the magnetic tunnel junction structure and/or the hard mask pattern are oxidized, a process time for such oxidation can be substantially reduced, e.g., as compared to oxidation of etching by-products caused by etching of a metal hard mask pattern. Further, in the method of forming a semiconductor device according to the embodiment, after the process of oxidizing the etching by-products is performed, the poly-silicon of the hard mask pattern may be easily converted into a metal silicide to define an intermediate electrode, thereby decreasing an overall resistance value thereof.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a magnetic tunnel junction structure on a lower electrode;
an intermediate electrode on the magnetic tunnel junction structure; and
an upper electrode on the intermediate electrode,
wherein the intermediate electrode includes a lower portion and an upper portion having a side surface profile different from that of the lower portion, sidewalls of the upper portion being sloped and collinear with sidewalls of the upper electrode, and
wherein the lower portion and the upper portion include a metal silicide.

2. The semiconductor device as claimed in claim 1, wherein side surfaces of the magnetic tunnel junction structure are vertically aligned with side surfaces of the lower portion, respectively.

3. The semiconductor device as claimed in claim 2, wherein a horizontal width along an uppermost surface of the lower portion is smaller than a horizontal width of a lowermost surface of the lower portion.

4. The semiconductor device as claimed in claim 1, wherein a horizontal width of an uppermost surface of the upper portion is greater than horizontal width of a lowermost surface of the upper portion.

5. The semiconductor device as claimed in claim 4, wherein the upper portion is in direct contact with the lower portion, and the horizontal width of the lowermost surface of the upper portion is smaller than a horizontal width of an uppermost surface of the lower portion.

6. The semiconductor device as claimed in claim 4, wherein side surfaces of the upper portion are vertically aligned with side surfaces of the upper electrode, respectively.

7. The semiconductor device as claimed in claim 1, wherein a vertical height of the upper portion is smaller than a vertical height of the lower portion.

8. The semiconductor device as claimed in claim 1, further comprising a liner insulating layer on the magnetic tunnel junction structure and on the lower portion, the liner insulating layer exposing an upper surface of the upper portion.

9. The semiconductor device as claimed in claim 8, wherein the upper surface of the upper portion is lower than an uppermost surface of the liner insulating layer.

10. The semiconductor device as claimed in claim 8, further comprising a by-product oxide layer between the magnetic tunnel junction structure and the liner insulating layer, and between the liner insulating layer and side surfaces of the lower portion.

11. The semiconductor device as claimed in claim 10, wherein a horizontal width of the by-product oxide layer decreases as a distance from a lowermost surface of the magnetic tunnel junction structure decreases.

12. A semiconductor device, comprising:
a magnetic tunnel junction structure;
an upper electrode on the magnetic tunnel junction structure, the upper electrode having a side surface profile different from a side surface profile of the magnetic tunnel junction structure; and
an intermediate electrode between the magnetic tunnel junction structure and the upper electrode, an entire bottom surface of the upper electrode being in direct contact with a top surface of the intermediate electrode, and the intermediate electrode including a metal silicide.

13. The semiconductor device as claimed in claim 12, wherein a level of an uppermost surface of the intermediate electrode is at a same level as a lower surface of the upper electrode.

14. The semiconductor device as claimed in claim 12, wherein the upper electrode includes a metal pattern, a barrier pattern on the metal pattern, and a conductive pattern on the barrier pattern, the metal pattern and the barrier pattern being U-shaped.

15. A semiconductor device, comprising:
a magnetic tunnel junction structure on a lower electrode;
an intermediate electrode on the magnetic tunnel junction structure, the intermediate electrode including metal silicide; and
an upper electrode directly on the intermediate electrode, an entire bottom surface of the upper electrode being in direct contact with a top surface of the intermediate electrode, and the metal silicide in the intermediate electrode including a same metal as the upper electrode.

16. The semiconductor device as claimed in claim 15, wherein a shape of a cross-section of the upper electrode is different from a shape of a cross-section of the intermediate electrode.

17. The semiconductor device as claimed in claim 15, wherein the intermediate electrode includes a first portion and a second portion, the first and second portions have different shapes in a cross-sectional view.

18. The semiconductor device as claimed in claim 17, wherein the second portion is between the first portion and the upper electrode, sidewalls of the upper electrode being sloped and collinear with respective sidewalls of the second portion.

19. The semiconductor device as claimed in claim 18, wherein sidewalls of the first portion are collinear with respective sidewalls of the magnetic tunnel junction structure.

20. A method of forming a semiconductor device, the method comprising:
forming a magnetic tunnel junction layer on a lower electrode;
forming a hard mask pattern including poly-silicon on the magnetic tunnel junction layer;
patterning the magnetic tunnel junction layer using the hard mask pattern as an etching mask to form a magnetic tunnel junction structure;
converting the poly-silicon of the hard mask pattern on the magnetic tunnel junction structure into a metal silicide, such that an intermediate electrode including metal silicide is formed on the magnetic tunnel junction structure; and
forming an upper electrode directly on the intermediate electrode, an entire bottom surface of the upper electrode being in direct contact with a top surface of the intermediate electrode, and the metal silicide in the intermediate electrode including a same metal as the upper electrode.

21. The method as claimed in claim 20, wherein forming the hard mask pattern includes forming a poly-silicon hard mask with an impurity.

22. The method as claimed in claim 21, wherein the impurity includes carbon.

23. The method as claimed in claim 20, further comprising oxidizing etching by-products disposed on surfaces of the magnetic tunnel junction structure and the hard mask pattern, before converting the poly-silicon of the hard mask pattern into the metal silicide.

24. The method as claimed in claim 23, further comprising forming a liner insulating layer on the substrate, after oxidizing the etching by-products is complete, and before converting the poly-silicon of the hard mask pattern into the metal silicide.

25. The method as claimed in claim 24, further comprising removing the oxidized etching by-products, before forming the liner insulating layer.

26. The method as claimed in claim 20, wherein forming the magnetic tunnel junction structure includes an ion beam etch (IBE) process.

27. A method of forming a semiconductor device, the method comprising:
forming a magnetic tunnel junction layer on a lower electrode;
forming a poly-silicon layer on the magnetic tunnel junction layer;
patterning the poly-silicon layer so that a hard mask pattern is formed;
patterning the magnetic tunnel junction layer using the hard mask pattern as an etching mask so that a magnetic tunnel junction structure is formed;
oxidizing etching by-products deposited on the magnetic tunnel junction structure and the hard mask pattern so that a by-product oxide layer is formed;
forming a metal layer on an upper surface of the hard mask pattern disposed on the magnetic tunnel junction structure;
forming an intermediate electrode on the magnetic tunnel junction structure by a silicide process; and
forming an upper electrode on the intermediate electrode, an entire bottom surface of the upper electrode being in direct contact with a top surface of the intermediate electrode, and the metal silicide in the intermediate electrode including a same metal as the upper electrode.

28. The method as claimed in claim 27, wherein forming the metal layer includes:
forming an interlayer insulating layer which covers the magnetic tunnel junction structure and the hard mask pattern;
forming a via-hole in the interlayer insulating layer, such that the via-hole exposes an upper surface of the hard mask pattern; and
depositing a metal material on the interlayer insulating layer in which the via-hole is formed.

29. The method as claimed in claim 28, wherein a horizontal width of a bottom surface of the via-hole is smaller than that of an upper surface of the hard mask pattern.

30. The method as claimed in claim 28, wherein the metal layer is formed to be thicker on sidewalls of the via-hole than on an upper surface of the hard mask pattern.

31. The method as claimed in claim 28, further comprising removing the by-product oxide layer, and forming a liner insulating layer on the magnetic tunnel junction structure and the hard mask pattern, before forming the interlayer insulating layer.

32. The method as claimed in claim 27, further comprising forming a barrier layer on the metal layer, before forming the intermediate electrode.

33. The method as claimed in claim 27, wherein forming the intermediate electrode includes converting materials of the entire hard mask pattern and a part of the metal layer into metal silicide.

34. The method as claimed in claim 33, further comprising removing the metal layer not converted into intermediate electrode, before forming the upper electrode.

\* \* \* \* \*